(12) United States Patent
Kawamura et al.

(10) Patent No.: US 8,848,389 B2
(45) Date of Patent: Sep. 30, 2014

(54) TRANSMISSION DEVICE AND METHOD FOR MANUFACTURING SAME, AND WIRELESS TRANSMISSION DEVICE AND WIRELESS TRANSMISSION METHOD

(75) Inventors: Hirofumi Kawamura, Chiba (JP); Yasuhiro Okada, Tokyo (JP)

(73) Assignee: Sony Corporation, Tokyo (JP)

( * ) Notice: Subject to any disclaimer, the term of this patent is extended or adjusted under 35 U.S.C. 154(b) by 3 days.

(21) Appl. No.: 13/062,121

(22) PCT Filed: Sep. 15, 2009

(86) PCT No.: PCT/JP2009/066080
§ 371 (c)(1),
(2), (4) Date: Mar. 3, 2011

(87) PCT Pub. No.: WO2010/035660
PCT Pub. Date: Apr. 1, 2010

(65) Prior Publication Data
US 2011/0158344 A1 Jun. 30, 2011

(30) Foreign Application Priority Data

Sep. 25, 2008 (JP) ................................ 2008-246510
Aug. 31, 2009 (JP) ................................ 2009-200116

(51) Int. Cl.
| | |
|---|---|
| *H05K 1/11* | (2006.01) |
| *H04B 3/52* | (2006.01) |
| *H01P 5/107* | (2006.01) |
| *H01P 5/02* | (2006.01) |
| *H01P 1/04* | (2006.01) |
| *H05K 1/14* | (2006.01) |
| *H05K 1/02* | (2006.01) |

(52) U.S. Cl.
CPC .............. *H01P 5/107* (2013.01); *H05K 1/0237* (2013.01); *H05K 2201/10303* (2013.01); *H04B 3/52* (2013.01); *H01P 5/028* (2013.01); *H01P 1/047* (2013.01); *H05K 1/144* (2013.01); *H05K 2201/042* (2013.01); *H05K 2201/037* (2013.01)
USPC .......................................... 361/792; 361/803

(58) Field of Classification Search
CPC ......... H01P 1/047; H01P 5/028; H01P 5/107; H04B 3/42; H05K 1/0237; H05K 1/144; H05K 2201/037; H05K 2201/042; H05K 2201/10303

USPC .......... 174/250, 255, 256, 260, 266; 361/803, 361/792, 795, 790; 257/275, E23.29, 257/E29.231; 333/254, 255, 248, 246
See application file for complete search history.

(56) References Cited

U.S. PATENT DOCUMENTS

| | | | |
|---|---|---|---|
| 4,427,316 A | * | 1/1984 | Moore et al. ...................... 403/2 |
| 5,717,407 A | | 2/1998 | Hong |

(Continued)

FOREIGN PATENT DOCUMENTS

| | | |
|---|---|---|
| CN | 101174737 | 5/2008 |
| JP | 56-103501 | 8/1981 |

(Continued)

OTHER PUBLICATIONS

International Search Report dated Dec. 28, 2009.

(Continued)

*Primary Examiner* — Yuriy Semenenko
(74) *Attorney, Agent, or Firm* — Dentons US LLP

(57) ABSTRACT

An electronic device provided with a plurality of circuit boards uses a support member for supporting the circuit boards as the transmission path of a wireless signal. For example, the electronic device is provided with a first printed circuit board for processing a millimeter-wave signal, a second printed circuit board which is signal-coupled to the printed circuit board and receives the millimeter-wave signal to subject the received signal to signal processing, and a waveguide which is disposed with a predetermined dielectric constant between the printed circuit boards, wherein the waveguide constitutes the dielectric transmission path, and the waveguide supports the printed circuit boards. This configuration makes it possible to receive the electromagnetic wave based on a millimeter-wave signal radiated from one end of the waveguide constituting the dielectric transmission path, at the other end thereof.

13 Claims, 21 Drawing Sheets

(56) References Cited

U.S. PATENT DOCUMENTS

| | | | |
|---|---|---|---|
| 6,362,703 B1 | 3/2002 | Keesey et al. | |
| 6,882,247 B2 * | 4/2005 | Allison et al. | 333/182 |
| 2003/0027530 A1 | 2/2003 | Levitt et al. | |
| 2006/0044083 A1 | 3/2006 | Kuzmenka | |
| 2007/0215913 A1 * | 9/2007 | Okubora | 257/275 |
| 2008/0153416 A1 | 6/2008 | Washiro | |
| 2009/0309680 A1 * | 12/2009 | Suzuki | 333/254 |

FOREIGN PATENT DOCUMENTS

| | | |
|---|---|---|
| JP | 63-213198 | 9/1988 |
| JP | 05-183333 | 7/1993 |
| JP | 08-008618 | 1/1996 |
| JP | 08-288738 | 11/1996 |
| JP | 09-153730 | 6/1997 |
| JP | 11-308021 | 11/1999 |
| JP | 2004-220264 | 8/2004 |
| JP | 2007-251394 | 9/2007 |
| JP | 4077847 | 2/2008 |
| JP | 2008-067012 | 3/2008 |
| JP | 2008-099235 | 4/2008 |

OTHER PUBLICATIONS

European Search Report dated Aug. 2, 2012, in connection with counterpart EP Application No. 09 81 6075.
Japanese Patent Office; Office Action for Application No. 2009-200116, dated Dec. 17, 2013.
Chinese Office Action dated Nov. 5, 2013 corresponding to Chinese Serial No. 200980135732.9.
The State Intellectual Property Office of the People's Republic of China; Fourth Office Action; Dated Feb. 7, 2014 for Application No. 200980135732.9.

* cited by examiner

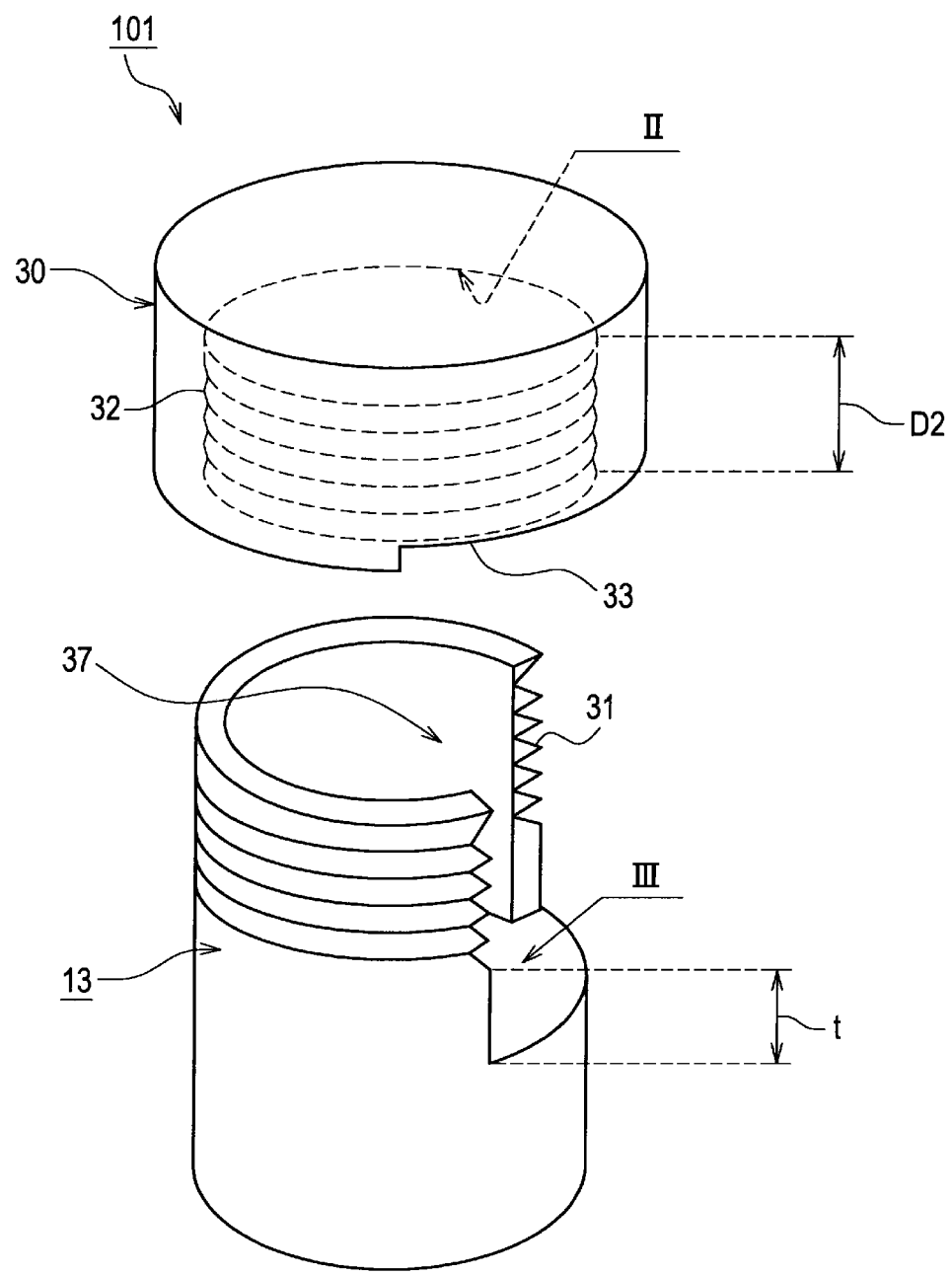

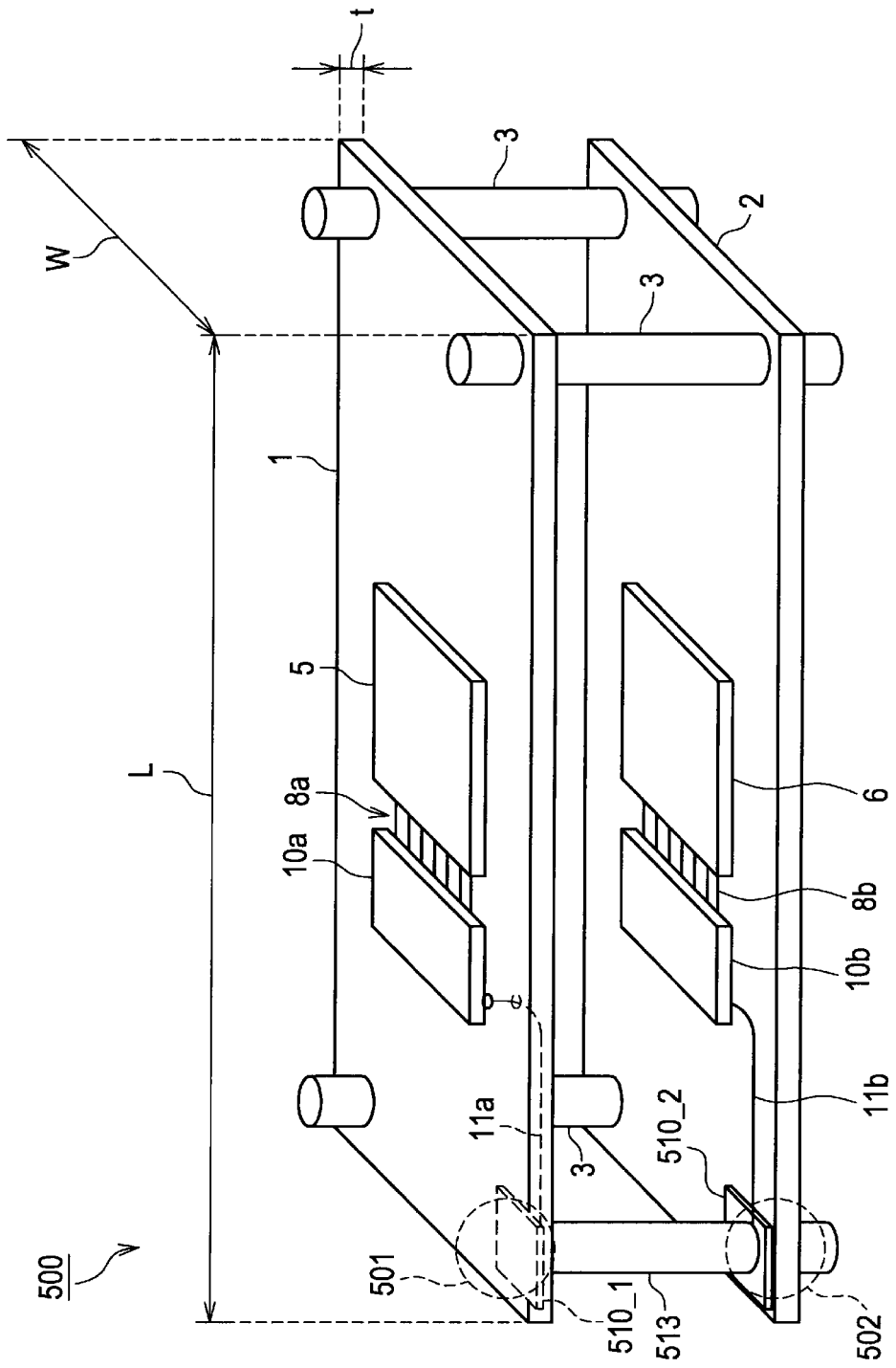

CARRIER FREQUENCY [GHz]

Related Art

TRANSMISSION DEVICE AND METHOD FOR MANUFACTURING SAME, AND WIRELESS TRANSMISSION DEVICE AND WIRELESS TRANSMISSION METHOD

TECHNICAL FIELD

The present invention relates to an in-millimeter-wave dielectric transmission device, a manufacturing method thereof, a wireless transmission device, and a wireless transmission method. For example, the present invention relates to a mechanism in which a carrier frequency for carrying a movie image, a computer image and the like transmits a signal of a microwave band or a millimeter wave band of 30 GHz to 300 GHz at a high speed.

BACKGROUND ART

In the related art, printed boards have been used as plate-shaped parts including electronic parts such as resistors, capacitors and semiconductor integrated circuit devices mounted thereon and to perform electrical wiring. In general, when constituting an electronic device, a plurality of printed boards are provided in parallel in a housing of the electronic device to contribute to a physical configuration or a functional configuration of the electronic device. Furthermore, various methods for fixedly supporting a multi-stage structure, which is formed by stacking printed boards using support members provided at four corners thereof in a housing, have been proposed.

Meanwhile, with a recent significant increase in the amount of information such as videos and images, various devices have been used to transmit high frequency signals such as millimeter wave signals at a high speed. For such a high speed data transmission device, it is necessary to transmit high frequency signals such as millimeter wave signals with no error.

FIG. 20 is a perspective view showing an example of the configuration of a high speed data transmission device 900 according to the related art. The high speed data transmission device 900 shown in FIG. 20 has a multi-stage structure formed by stacking two printed boards 1 and 2 using fixing members 3 provided at four corners thereof in order to transmit data between the printed boards 1 and 2 at a high speed. In FIG. 20, the high speed data transmission device 900 includes the two printed boards 1 and 2 and the four fixing members 3 for normal support, and the printed boards 1 and 2 are fixed in parallel to each other by the fixing members 3 provided at the four corners thereof. According to a method of fixing the printed boards 1 and 2, through holes 4 having a predetermined shape are opened in the four corners of each of the printed boards 1 and 2, the fixing members 3 are inserted into the through holes 4, and the printed boards 1 and 2 are held by the fixing members 3 while interposing the fixing members 3 therebetween.

The printed board 1 is provided on the upper surface thereof with a signal processing unit 5, a connector 7 and an electrical wiring 8. The electrical wiring 8 of the printed board 1 connects the signal processing unit 5 to the connector 7. The printed board 2 is provided on the upper surface thereof with a signal processing unit 6, a connector 7 and an electrical wiring 8. The electrical wiring 8 of the printed board 2 connects the connector 7 to the signal processing unit 6. According to the high speed data transmission device 900, a cable 9 is connected between the connector 7 of the printed board 1 and the connector 7 of the printed board 2, so that data is transmitted between the printed boards 1 and 2 at a high speed.

Meanwhile, in order to reduce the cost of the high speed data transmission device 900 and the like and improve the arrangement efficiency of the printed boards 1 and 2, there have been attempts to remove the connector 7 and the cable 9. In relation to the improvement of such a type of high speed data transmission device 900, Patent Literature 1 discloses an electronic device that performs data exchange using a wireless communication method.

According to the electronic device, device configuration units and a wireless communication unit are provided, and the wireless communication unit relays data exchange between the device configuration units through UWB wireless communication in a housing. Based on that fact, a radio wave absorber is provided in the housing to absorb an electromagnetic wave serving as noise of communication between the device configuration units via the wireless communication unit. When the electronic device is configured as described above, the radio wave absorber absorbs an electromagnetic wave in the housing, resulting in the suppression of multipath phasing in the housing.

Furthermore, Patent Literature 2 discloses fixing members for fixing a plurality of circuit boards and a module using the fixing members. According to the module, a plurality of fixing members provided with light waveguides are provided, optical coupling is achieved between one circuit board and the other circuit board at both ends of each fixing member, and the plurality of circuit boards are fixed while being spaced apart from each other at a predetermined distance. Based on that fact, an optical signal is propagated between the circuit boards through the light waveguides of the fixing members. When the module is configured as described above, it is possible to accurately transmit information between the circuit boards using an optical signal as a medium.

CITATION LIST

Patent Literature

Patent Literature 1: Japanese Unexamined Patent Application Publication No 2004-220264 (3 claims FIG. 1)
Patent Literature 2: Japanese Patent Registration No 4077847 (11 claims FIG. 1)

SUMMARY OF INVENTION

Technical Problem

In recent years, with an increase in a signal processing speed on a printed board, when constructing the high speed data transmission device 900 according to the related art, a high speed data transmission device in which disturbance is reduced by applying a signal transmission technology of a millimeter band, or a data transmission system thereof, the following problems occur.

i. according to the high speed data transmission device 900 shown in FIG. 20, it is necessary to use the connector 7 and the cable 9 in order to electrically connect the two printed boards 1 and 2. In addition, it is necessary to ensure an area for turning the cable 9 in the housing.

ii. according to the electronic device using the wireless communication method as disclosed in Patent Literature 1, when the housing is shielded by a metal, a radio wave is reflected in a free space in the housing. The radio reflection in the housing causes multipath interference, resulting in the deterioration of data transmission performance. Thus, in order to reduce the multipath interference, employing a multi-carrier modulation method may be considered. However, this may cause an increase in a system size and power consumption.

Meanwhile, employing a method of lowering the output level of wireless power of the wireless communication unit to limit a wireless communication area may also be considered. However, the arrangement of the wireless communication unit on the printed board may be limited and the degree of freedom of the arrangement of electronic parts may be restricted.

iii. according to the module as disclosed in Patent Literature 2, since light is used in order to transmit data, it is necessary to prepare a light emitting element to send light into the light waveguide of the fixing member, a lens, a reflection plate, a light receiving element and the like. Furthermore, due to low permission for positioning of an optical axis and position deviation of the optical axis, it is difficult to configure the high speed data transmission system between the printed boards. Therefore, the structure of a signal processing board for being optically coupled to the fixing member is significantly complicated and the system size is increased, resulting in an increase in the manufacturing cost.

The present invention is made in view of the above-mentioned issue, and aims to provide a mechanism capable of solving at least one of the above problems.

Solution to Problem

According to a first aspect of the present invention in order to achieve the above-mentioned object, there is provided an in-millimeter-wave dielectric transmission device including: a first signal processing board for processing a millimeter wave signal; a second signal processing board signal-coupled to the first signal processing board to receive the millimeter wave signal and perform signal processing with respect to the millimeter wave signal; and a support member provided between the first signal processing board and the second signal processing board, wherein the support member constitutes a dielectric transmission path and supports the first signal processing board and the second signal processing board.

That is, according to the first aspect of the present invention, the in-millimeter-wave dielectric transmission device includes a support member provided between a first signal processing board for processing a millimeter wave signal and a second signal processing board for receiving a millimeter wave signal and performing signal processing with respect to the millimeter wave signal, and the support member constitutes a dielectric transmission path and supports the first signal processing board and the second signal processing board, so that it is possible to use the original support structure of the support member as a signal transmission path and to remove a communication cable, a connector and the like for connecting the first signal processing board to the second signal processing board according to the related art.

With such a mechanism, an electromagnetic wave based on a millimeter wave signal, which is radiated from one end of a support member constituting a dielectric transmission path, may be received in the other end of the support member. Consequently, since the original support structure of the support member may be used as a signal transmission path, it is possible to remove the communication cable, the connector and the like for connecting a first signal processing board to a second signal processing board according to the related art.

A method of manufacturing an in-millimeter-wave dielectric transmission device according to the present invention includes the steps of: forming a first signal processing board for processing a millimeter wave signal; forming a second signal processing board for receiving the millimeter wave signal from the first signal processing board and performing signal processing with respect to the received millimeter wave signal; and providing a support member between the first signal processing board and the second signal processing board, allowing the support member to form a dielectric transmission path, and allowing the support member on the second signal processing board to support the first signal processing board and the second signal processing board.

In manufacturing the in-millimeter-wave dielectric transmission device according to the present invention, it is possible to manufacture an in-millimeter-wave dielectric transmission device in which the support member constitutes a dielectric transmission path and supports the first signal processing board and the second signal processing board.

According to a second aspect of the present invention in order to achieve the above-mentioned object, there are provided a wireless transmission device and a wireless transmission method including a first circuit board (of a transmission side) including a first signal converting section for converting a signal to be transmitted to a high frequency signal with a high frequency (e.g., of a millimeter wave band or a microwave band), a second circuit board (of a reception side) including a second signal converting section for receiving a wireless signal (an electromagnetic wave) based on the high frequency signal generated by the signal converting section, and converting the wireless signal to the signal to be transmitted, and a support member provided between the first circuit board and the second circuit board to support the first circuit board and the second circuit board. The wireless signal is not limited to a millimeter wave signal.

Herein, in the second aspect according to the present invention, the support member constitutes a wireless signal transmission path for transmitting a wireless signal from the first circuit board side to the second circuit board side. That is, in an electronic device including a plurality of circuit boards, it may be said that the support member for supporting the circuit boards is used as a transmission path of a wireless signal. In the support member, a shield member for blocking external radiation of a wireless signal is first provided to surround the transmission path.

According to the first aspect, the support member may be a cavity waveguide in which a transmission path inside a shield member is hollow. In such a case, the second aspect according to the present invention is characterized in that the support member is not used as a dielectric transmission path and is used as a hollow waveguide by causing the support member to have a hollow structure, as compared with the in-millimeter-wave dielectric transmission device according to the present invention. That is, the support member employing the cavity waveguide is used and the inside of the support member is used for inter-board transmission.

Furthermore, according to the second aspect, in the support member, a dielectric material may be filled in the transmission path inside the shield member. In such a case, the second aspect according to the present invention is the same in that the support member is used as a dielectric transmission path, as compared with the in-millimeter-wave dielectric transmission device according to the present invention. However, a difference exists in the fact that a wireless signal is not limited to a millimeter wave signal.

Advantageous Effects of Invention

According to the present invention, a wireless signal (an electromagnetic wave) based on a high frequency signal (including a millimeter wave signal) signal-coupled to one end of a support member constituting a wireless signal transmission path (including a dielectric transmission path) can be transmitted to the other end of the support member, and a high frequency signal (including a millimeter wave signal) signal-coupled to other end can be received. Consequently, since the original support structure of the support member can be used as a wireless signal transmission path, it is possible to remove a communication cable, a connector and the like for connecting a first signal processing board to a second signal processing board according to the related art.

Since the inside of a support member is used as a transmission path of a wireless signal, it is possible to solve a problem (e.g., multipath interference and the like) caused by reflection of an electromagnetic wave in a free space inside a housing.

Since the inside of a support member is used as a transmission path of a wireless signal, it is possible to solve a problem (complication of the structure of a signal processing board for being optically coupled to a fixing member, and the like) when employing the mechanism disclosed in Patent Literature 2.

BRIEF DESCRIPTION OF DRAWINGS

FIG. 3 is a perspective view showing an example of the shape of a waveguide 513 and a dielectric transmission path termination part 30.

FIG. 16 is a perspective view showing an example of the configuration of a wireless transmission device 500 as a fifth embodiment.

Figure 1:
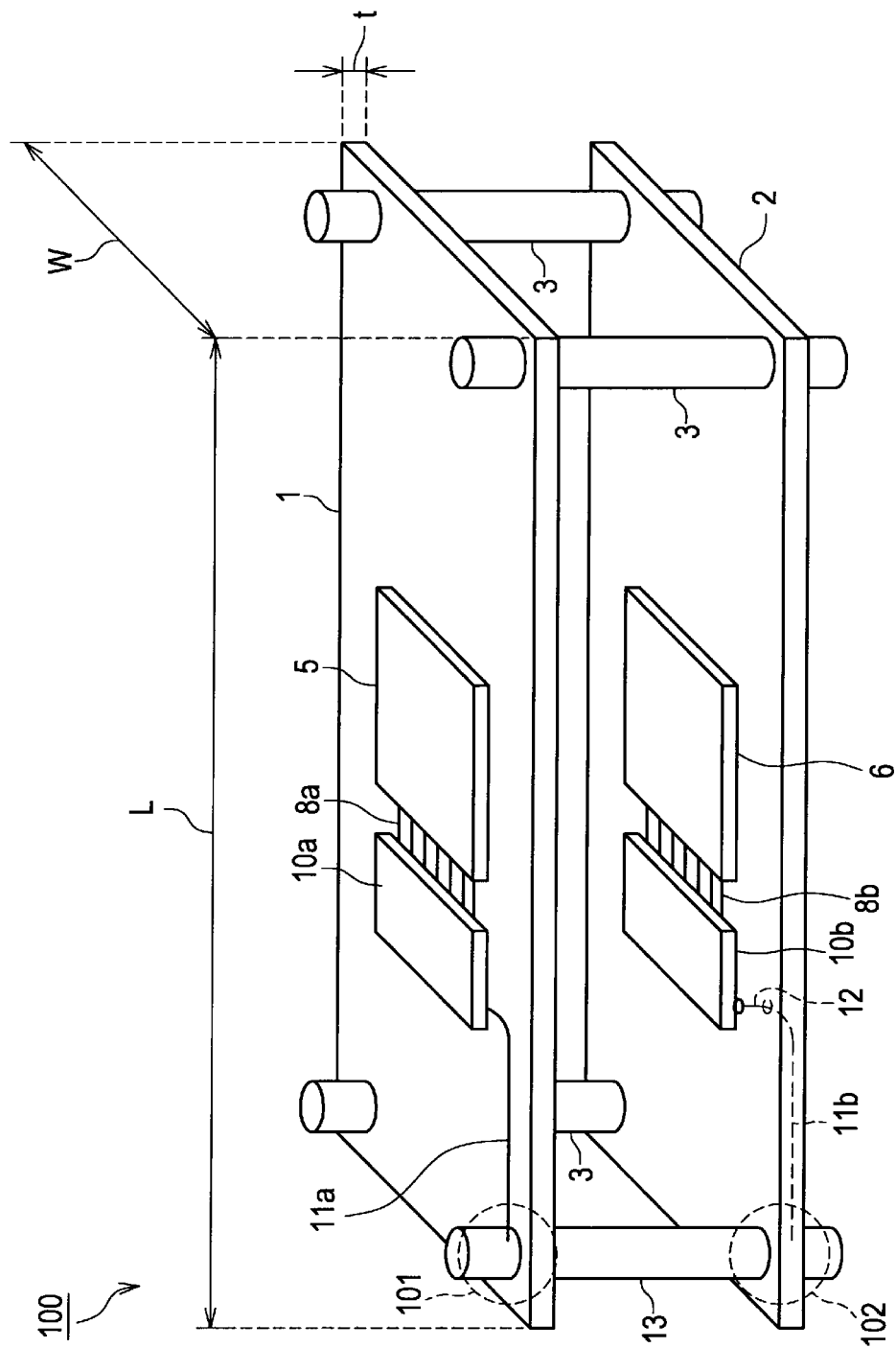
FIG. 1 is a perspective view showing an example of the configuration of a wireless transmission device 500 as a first embodiment.

REFERENCE SIGNS LIST 1 printed board (first signal processing board)
2 printed board (second signal processing board)
3, 17, 19 fixing member
4, 26 through hole
5, 6, 15 signal processing unit
8a, 8b, 8c electrical wiring
10a, 10b, 10c, 10d, 10e signal generating unit
11a, 11b, 111, 112, 113, 114, 115, 116, 117, 118 transmission line
12 contact hole (via hole)
13, 16, 18 fixing member constituting dielectric transmission path
20 conductor layer
21 transmission line layer
22 line
23a, 23b waveguide
24 conductor part
25 conductor layer
30, 34 dielectric transmission path termination part
30' fixing member termination stop part
31, 35 male thread structure
32, 37 female thread structure
33 gap part
101~109 antenna coupling unit
100, 200, 300, 400 in-millimeter-wave dielectric transmission device
201 signal input terminal
202 modulation circuit
203 frequency conversion circuit
204 amplifier
205, 207 coupling circuit
208 amplifier
209 frequency amplification circuit
210 demodulation circuit
211 signal output terminal
500 wireless transmission device
501, 502 antenna coupling unit
513 waveguide (support member constituting wireless signal transmission path)
510 dielectric board
520 microstrip line
530B patch antenna

DESCRIPTION OF EMBODIMENTS

Hereinafter, preferred embodiments of the present invention will be described in detail with reference to the appended drawings. Note that, in this specification and the drawings, elements that have substantially the same function and structure are denoted with the same reference signs, and repeated explanation is omitted.

Further, the description will be given in the following order.
1. First embodiment (two boards are stacked using columnar support members and a support member used as a dielectric transmission path is provided at one of four corners of each board)
2. Second embodiment (two boards are stacked using columnar support members and a support member used as a dielectric transmission path is provided at four corners)
3. Third embodiment (three boards are stacked using columnar support members and a support member used as a dielectric transmission path is provided at two of four corners of each board)
4. Fourth embodiment (two boards are provided in a row and horizontally supported by fixing members having a substantially flat U shape, and a fixing member used as a dielectric transmission path is provided at one place)
5. Fifth embodiment (general purpose configuration: a waveguide is used as a support member serving as a wireless signal transmission path)

First Embodiment

FIG. 1 is a perspective view showing an example of the configuration of an in-millimeter-wave dielectric transmission device 100 according to the first embodiment. The in-millimeter-wave dielectric transmission device 100 shown in FIG. 1 can be applied to a millimeter wave video data transmission device, a millimeter wave video data transmission system and the like, which convert data of a movie image, a computer image and the like into a millimeter wave signal and transmit the millimeter wave signal at a high speed, and have a carrier frequency of 30 GHz to 300 GHz to carry the millimeter wave signal.

The in-millimeter-wave dielectric transmission device 100 includes a first signal processing board (hereinafter, simply referred to as a printed board 1), a second signal processing board (hereinafter, simply referred to as a printed board 2), a plurality of fixing members 3 for normal support, and a support member (hereinafter, simply referred to as a fixing member 13) used as a dielectric transmission path, and has a structure in which the printed boards 1 and 2 are supported by the fixing members 3 and 13.

The printed board 1 converts data of a movie image, a computer image and the like into a millimeter wave signal. The size of the printed board 1, for example, is defined as a length L, a width W and a thickness t. The printed board 1 includes a first signal processing unit 5, a first signal generating unit 10a, a first transmission line 11a, and a first antenna coupling unit 101.

The signal processing unit 5 performs a process such as compression with respect to the data of the movie image, the computer image and the like based on a predetermined standard to output an electrical signal (hereinafter, referred to as an input signal). The signal processing unit 5 is connected to an electrical wiring 8a such as a wiring pattern. The electrical wiring 8a is connected to the signal generating unit 10a. The signal generating unit 10a performs signal processing with respect to the input signal to generate the millimeter wave signal.

The signal generating unit 10a is connected to one end of the transmission line 11a. The transmission line 11a is electrically connected between the signal generating unit 10a and the antenna coupling unit 101 to transmit the millimeter wave signal. In this embodiment, the transmission line 11a electrically transmits the millimeter wave signal constituting the data of the movie image, the computer image and the like. A scheme of a strip line, a microstrip line, a coplanar line, a slot line and the like is applied to the transmission line 11a on the printed board 1.

The antenna coupling unit 101 is coupled to (disposed at) the other end of the transmission line 11a. The antenna coupling unit 101 couples the millimeter wave signal, which is transmitted from the signal generating unit 10a through the transmission line 11a, to one end of the fixing member 13. In this embodiment, the antenna coupling unit 101 converts the millimeter wave signal into an electromagnetic wave, and radiates the electromagnetic wave into the fixing member 13 constituting a dielectric transmission path. At the time of bi-directional data transmission, the antenna coupling unit 101 transfers millimeter wave video data between the transmission line 11a connected to the signal generating unit 10a and the fixing member 13 constituting the dielectric transmission path.

The fixing member 13 is provided between the printed board 1 and the printed board 2 while having a predetermined dielectric constant. As the fixing member 13, a dielectric material at least including a glass epoxy-based, acryl-based, and polyethylene-based resin is used. In this embodiment, the three fixing members 3 are provided at four corners of each of the printed boards 1 and 2 together with the one fixing member 13 which divide the charge. The fixing member 13 is provided at a corner part of each of the printed boards 1 and 2, rather than the arrangement positions of the fixing members 3 for normal support.

The fixing member 13 not only constitutes the dielectric transmission path but also supports the printed board 1 and the printed board 2 together with the three fixing members 3. The support function includes a case where the printed board 2 holds up and supports the printed board 1 and a case where the printed board 1 is suspended and supports the printed board 2.

Furthermore, in the support mechanism, the fixing members 3 and 13 are fixed such that the printed board 1 and the printed board 2 are combined with each other in a predetermined direction and maintain the substantially parallel posture, for example, the printed board 1 and the printed board 2 are connected to each other in the vertical direction. When configuring the in-millimeter-wave dielectric transmission device 100 in this way, the printed board 1 and the printed board 2 can be fixedly stacked in a rack configuration in the vertical direction via the fixing members 3 and 13. In addition, the fixing members 3, for example, use a resin bar member formed in a cylindrical shape. Of course, except for the fixing member 13, the fixing members 3 may also use a metal bar member having a predetermined shape.

The printed board 2 is supported by the other ends of the fixing member 13 constituting the dielectric transmission path and the fixing members 3 for normal support. The printed board 2 is signal-coupled to the printed board 1, receives the millimeter wave signal and performs signal processing with respect to the millimeter wave signal. The printed board 2 has a size substantially equal to that of the printed board 1.

The printed board 2 includes a second antenna coupling unit 102, a second transmission line 11b, a second signal generating unit 10b, and a second signal processing unit 6. The second antenna coupling unit 102 is signal-coupled to the fixing member 13 constituting the dielectric transmission path, and receives an electromagnetic wave from the fixing member 13 to output a millimeter wave signal. In this embodiment, the second antenna coupling unit 102 converts the electromagnetic wave having been propagated through the dielectric transmission path of the fixing member 13 into the millimeter wave signal. In addition, the second antenna coupling unit 102 has a structure symmetrical to the first antenna coupling unit 101 with respect to the board surface.

One end of the transmission line 11b is coupled to (disposed at) the other end of the fixing member 13. The transmission line 11b is electrically connected between the signal generating unit 10b and the antenna coupling unit 102 to transmit the millimeter wave signal, which is output from the antenna coupling unit 102, to the signal generating unit 10b. In this embodiment, the transmission line 11b is provided on the rear surface of the printed board 2. Furthermore, the transmission line 11b on the rear surface of the printed board 2 is wired to the signal generating unit 10b on the surface of the printed board 2 through a contact hole 12 (a via hole). At the time of bi-directional data transmission, the antenna coupling unit 102 transmits millimeter wave video data between the transmission line 11b connected to the signal generating unit 10b and the fixing member 13 constituting the dielectric transmission path.

The signal generating unit 10b is connected to the other end of the transmission line 11b. The signal generating unit 10b performs signal processing with respect to the millimeter wave signal received in the antenna coupling unit 102 to generate an output signal. The signal generating unit 10b is connected to an electrical wiring 8b such as a wiring pattern. The electrical wiring 8b is connected to the signal processing unit 6. The signal processing unit 6 performs a process such as expansion with respect to the output signal, which is generated by the signal generating unit 10b, based on a predetermined standard, thereby achieving data of a movie image, a computer image and the like.

When configuring the in-millimeter-wave dielectric transmission device 100 in this way, it is possible to transmit the electromagnetic wave based on the millimeter wave signal, which is received from one end of the fixing member 13 constituting the dielectric transmission path, to the other end thereof, and a millimeter wave communication process can be performed between the printed board 1 and the printed board 2. In addition, in this embodiment, a case where a downlink data transmission path of the millimeter wave is configured has been described. However, the transmission function of the printed board 1 is provided to the printed board 2 and the reception function of the printed board 2 is provided to the printed board 1, so that data transmission/reception can be performed via the antenna coupling units 101 and 102 and the fixing member 13 constituting the dielectric transmission path.

According to the downlink data transmission path of the millimeter wave, data transmission using a millimeter wave signal as a medium is performed via the signal processing unit 5→the signal generating unit 10a→the transmission line 11a→the antenna coupling unit 101→the fixing member 13→the antenna coupling unit 102→the transmission line 11b→the signal generating unit 10b→the signal processing unit 6. According to an uplink data transmission path of the millimeter wave, data transmission using a millimeter wave signal as a medium is performed via the signal processing unit 6→the signal generating unit 10b→the transmission line 11b→the antenna coupling unit 102→the fixing member 13→the antenna coupling unit 101→the transmission line 11a→the signal generating unit 10a→the signal processing unit 5.

Figure 2A:
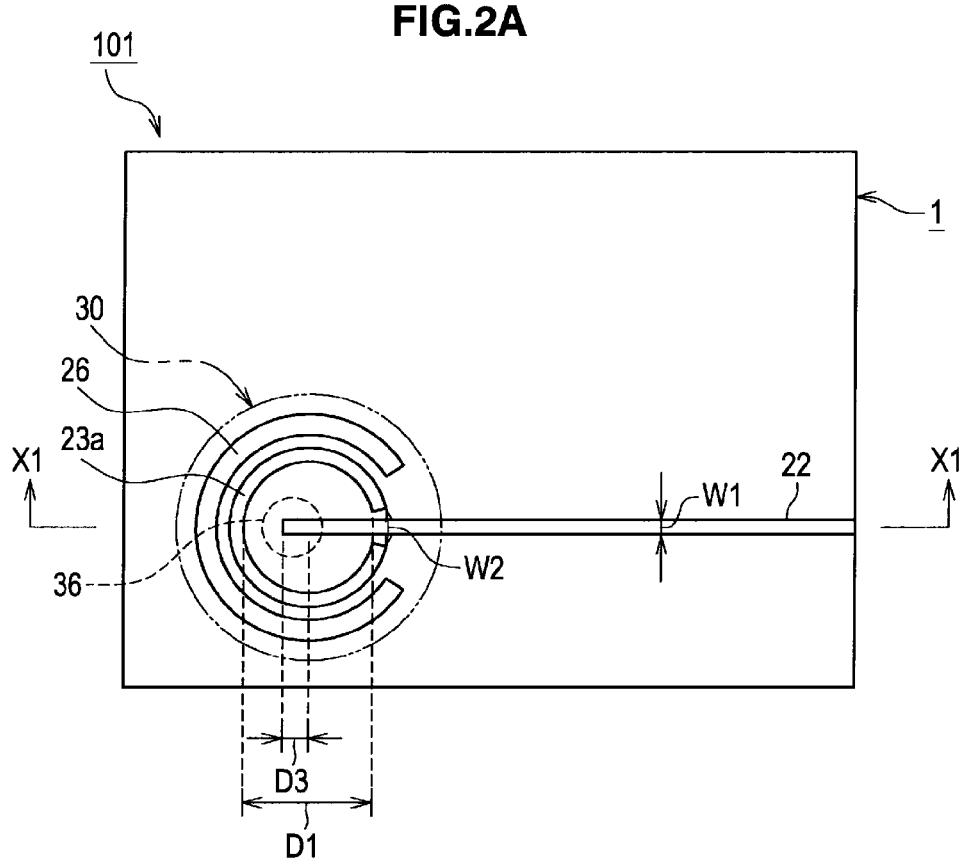
FIG. 2A is a plan view showing an example of the configuration of an antenna coupling unit 101.
Figure 2B:
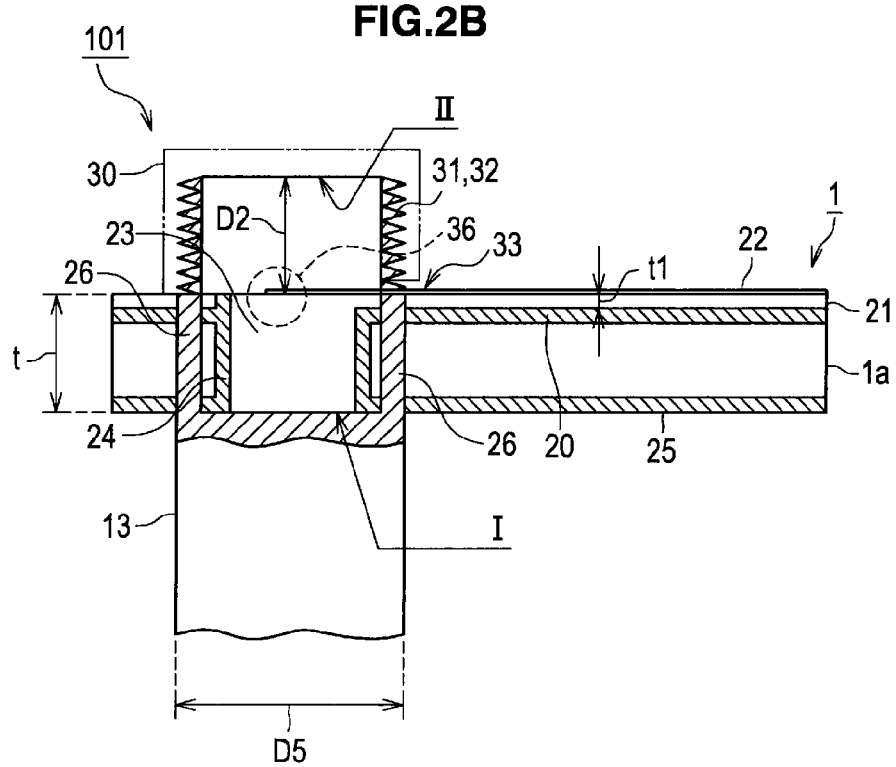
FIG. 2B is a cross-sectional view along a line X1-X2, which shows an example of the configuration of an antenna coupling unit 101.

FIG. 2A is a plan view showing an example of the configuration of the antenna coupling unit 101 and FIG. 2B is a cross-sectional view along a line X1-X2 of FIG. 2A, which shows the example of the configuration of the antenna coupling unit 101. In this embodiment, a microstrip line is applied to the transmission line 11a connected to the antenna coupling unit 101.

The antenna coupling unit 101 shown in FIG. 2A is provided to the printed board 1 and includes a first waveguide 23a, a through hole 26 having a predetermined shape, and a first signal converting section 36. The waveguide 23a has a cylindrical shape, but the upper portion of the first waveguide 23a has a horseshoe shape (substantially a C shape) in order to avoid a contact with the microstrip line. The waveguide 23a converts the millimeter wave signal, which is electrically transmitted through the transmission line 11a, into an electromagnetic wave and transmits the electromagnetic wave to the dielectric transmission path.

The through hole 26 is an opening through which the fixing member 13 constituting the dielectric transmission path shown in FIG. 2B is fixed to the printer board 1. In this embodiment, as shown in FIG. 2A, the through hole 26 has the same horseshoe shape as the upper portion of the waveguide 23a. In FIGS. 2A and 2B, a part indicated by a double dotted line denotes a dielectric transmission path termination part 30 constituting an example of a first fixing means, which fixes an end portion of the fixing member 13 to the printed board 1 (refer to FIG. 3).

The printed board 1 includes an insulation layer 1a shown in FIG. 2B. A conductive layer 20 constituting ground is provided on the insulation layer 1a and a conductive layer 25 constituting ground is also provided under the insulation layer 1a. A transmission line layer 21 having insulating properties is stacked on the conductive layer 20 and a line 22 having conductive properties is stacked on the transmission line layer 21. The line 22 is inserted into the waveguide 23a. The transmission line 11a (the microstrip line) includes the transmission line layer 21 and the line 22. For example, in the transmission line layer 21 on the conductive layer 20, the line 22 is patterned with a predetermined line width as shown in FIG. 2A, thereby forming the microstrip line. Hereinafter, the predetermined line width will be referred to as a line width W1 of the line 22. Hereinafter, the thickness of the transmission line layer 21 and the line 22 patterned on the conductive layer 20 will be generically and simply referred to as a film thickness t1.

An end portion of each of the conductive layers 20 and 25 is short-circuited (electrically conducted) by a conductor part 24 having a cylindrical shape and the conductor part 24 constitutes the waveguide 23a. The waveguide 23a, which has a cylindrical lower portion and a horseshoe-shaped upper portion, is provided by the conductor part 24 having a cylindrical shape for short-circuiting the conductive layers 20 and 25 for ground between the surface and the rear surface of the printed board 1. An inner side of the conductor part 24 is filled with a dielectric substance constituting the printed board 1, so that the dielectric transmission path is formed. Herein, a lower side surface of the waveguide 23a filled with the dielectric substance will be referred to as a waveguide surface I and a diameter of the waveguide 23a filled with the dielectric substance will be referred to as D1.

The waveguide 23a, for example, is formed as described below. First, an opening having a diameter D1 is opened in one corner of the mother board for forming the printed board 1. Next, a conductive member is provided to the inner wall of the opening to achieve conductivity, and the conductive layer 20 is electrically bonded to the conductive layer 25 by the conductor part 24 obtained through the processing of achieving the conductivity. Then, a dielectric substance constituting the printed board 1 is filled. In addition, the inner side of the conductor part 24 may be a hollow section at the time of waveguide formation.

The signal converting section 36 includes the line 22 provided to enter (be inserted into) the waveguide 23a. In this embodiment, on the basis of the waveguide 23a, the line 22 inside the waveguide 23a constitutes the signal converting section 36 and the line 22 outside the waveguide 23a constitutes the transmission line 11a. The signal converting section 36 converts a millimeter wave signal into an electromagnetic wave in the waveguide 23a. The signal converting section 36 has a distance D3 from the center position of the waveguide 23a to an end portion of the line 22 in the waveguide 23a. The line 22 protrudes leftward (on the plane) from the center position of the waveguide 23a.

In this embodiment, the through hole 26 as shown in FIG. 2A is opened in the printed board 1 around the waveguide 23a, and the end portion of the fixing member 13 is fitted into the through hole 26. According to the antenna coupling unit 101, the electromagnetic wave converted by the signal converting section 36 is transmitted to one end of the fixing member 13 constituting the dielectric transmission path, and the one end of the fixing member 13 is fixed to the printed board 1 by the through hole 26 surrounding the waveguide 23a.

FIG. 3 is a perspective view showing an example of the shape of the fixing member 13 and the dielectric transmission path termination part 30. In this embodiment, the fixing member 13 has substantially a C shape structure at the front end thereof such that the fixing member 13 can pass through the through hole 26 shown in FIG. 2A. The end portion of the fixing member 13 having passed through the through hole 26 is bonded to the dielectric transmission path termination part 30 shown in FIG. 3, so that the fixing member 13 is fixed to the printed board 1.

The end portion of the fixing member 13 shown in FIG. 3 has a cylindrical shape, and the fixing member 13 has a cutout part 37 at a part thereof to have substantially a C shape structure at the front end thereof. The cutout part 37 defines a part crossing the waveguide 23a. Herein, the upper surface side of the end portion of the fixing member 13 having the cutout part 37 will be referred to as a dielectric surface III. This embodiment employs a contact surface structure in which the waveguide surface I of the waveguide 23a makes contact with the dielectric surface III of the fixing member 13. An outer peripheral surface of a cylindrical part of the end portion of the fixing member 13 has a male thread structure 31.

The fixing member 13 is provided at the cylindrical end portion thereof with the dielectric transmission path termination part 30 constituting the first fixing means. The dielectric transmission path termination part 30 has a cover member (a shape of a cap, a hat and the like) with a ceiling, is screw-coupled with the upper end portion of the fixing member 13 to reflect an electromagnetic wave radiated to the waveguide 23a from the transmission line 11a, and fixes the one end of the fixing member 13 to the printed board 1. In this embodiment, when the upper surface of the inner side of the cover member of the dielectric transmission path termination part 30 is defined as a ceiling surface II, the entire surface of the inner wall of the dielectric transmission path termination part 30 is made of a metal or resin plated with a metal, and an electromagnetic wave radiated from the line 22 in the waveguide 23a is reflected by the ceiling surface II.

In this embodiment, the dielectric transmission path termination part 30 is provided on the inner side surface thereof with a female thread structure 32 corresponding to the male thread structure 31 of the fixing member 13 shown in FIG. 3. The female thread structure 32 of the dielectric transmission path termination part 30 is fitted around the male thread structure 31 of the fixing member 13. For example, the female thread structure 32 of the dielectric transmission path termination part 30 is allowed to circularly move along the male thread structure 31 of the fixing member 13, so that the printed board 1 shown in FIG. 2A is fixed by the fixing member 13.

In addition, in the case where the distance between the printed board 1 and the ceiling surface II when the dielectric transmission path termination part 30 is fitted around the fixing member 13 is defined as D2, the distance D2 is set to ¼ of the wavelength λ of a millimeter wave signal on the air and adjusted to enhance an electromagnetic wave, so that the millimeter wave signal can be efficiently converted into an electromagnetic wave.

The dielectric transmission path termination part 30 for fixing the one end of the fixing member 13 has a first gap part 33 corresponding to the cutout part 37 through which the line 22 shown in FIGS. 2A and 2B crosses the waveguide 23a. The gap part 33 is set to have a predetermined width between one end and the other end of the waveguide 23a having a horseshoe shape. Hereinafter, the predetermined width will be referred to as an opening width W2 of the gap part 33. The gap part 33 having the opening width W2 is provided to prevent the conductor part 24 from making contact with the line 22 at the time of bonding the printed board 1 to the fixing member 13. In addition, the antenna coupling unit 102 has the same configuration as the antenna coupling unit 101 (refer to FIG. 5).

When configuring the in-millimeter-wave dielectric transmission device 100 in this way, it is possible to confine an electromagnetic wave based on a millimeter wave signal in the fixing member 13 constituting the dielectric transmission path. Furthermore, a millimeter wave signal can be converted into an electromagnetic wave at the one end of the fixing member 13 constituting the dielectric transmission path, and an electromagnetic wave can be converted into a millimeter wave signal at the other end of the fixing member 13.

Figure 4:
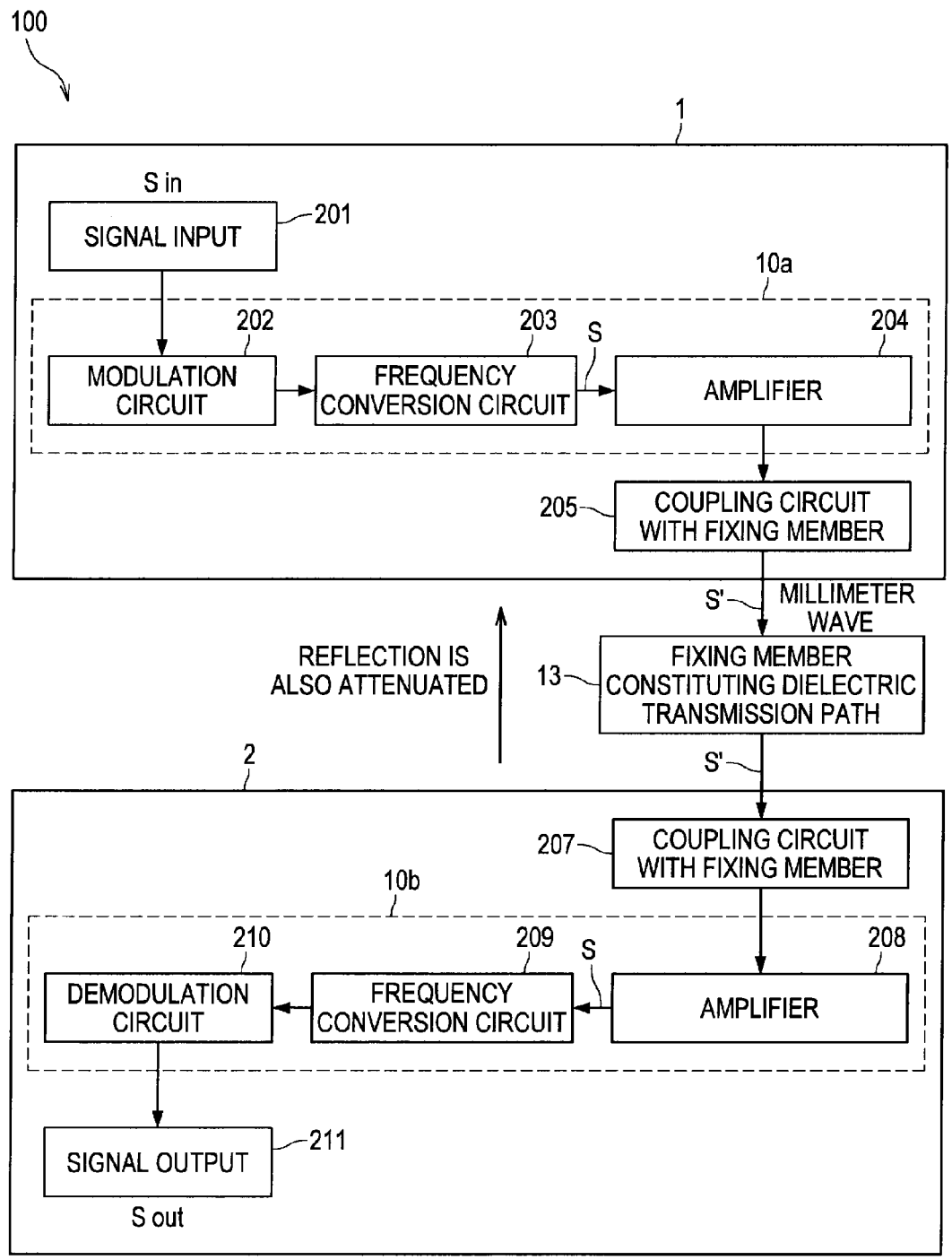
FIG. 4 is a block diagram showing an example of the configuration of a wireless transmission device 500.

Next, an example of the circuit configuration of the in-millimeter-wave dielectric transmission device 100 will be described. FIG. 4 is a block diagram showing an example of the configuration of the in-millimeter-wave dielectric transmission device 100. The in-millimeter-wave dielectric transmission device 100 shown in FIG. 4 constitutes an example of the downlink data transmission path of the millimeter wave, and is a millimeter wave video data transmission device which can be applied to an image processing device and the like for transmitting a millimeter wave signal with a frequency of 30 GHz to 300 GHz at a high speed.

The in-millimeter-wave dielectric transmission device 100 includes the printed board 1 on which a signal input terminal 201, the signal generating unit 10a and a coupling circuit 205 are mounted, the fixing member 13 bonded to the printed board 1, and the printed board 2 on which a coupling circuit 207, the signal generating unit 10b and a signal output terminal 211 are mounted. The coupling circuit 205 includes the transmission line 11a and the antenna coupling unit 101 shown in FIGS. 1, 2A, 2B and 3, and the coupling circuit 207 includes the transmission line 11b and the antenna coupling unit 102 shown in the same drawings. The signal generating unit 10a and the signal generating unit 10b include a CMOS-IC device.

The signal generating unit 10a connected to the signal input terminal 201, for example, includes a modulation circuit 202, a first frequency conversion circuit 203 and an amplifier 204 in order to generate a millimeter wave signal S by performing signal processing with respect to an input signal Sin. The modulation circuit 202 is connected to the signal input terminal 201 to modulate the input signal Sin. For example, a phase modulation circuit is used as the modulation circuit 202.

The frequency conversion circuit 203 is connected to the modulation circuit 202 to generate the millimeter wave signal S by frequency-converting the input signal Sin modulated by the modulation circuit 202. Herein, the millimeter wave signal S is a signal having a frequency in the range of 30 GHz to 300 GHz. The amplifier 204 is connected to the frequency conversion circuit 203 to amplify the frequency-converted millimeter wave signal S.

The coupling circuit 205 including the transmission line 11a and the antenna coupling unit 101 is connected to the amplifier 204 to transmit the millimeter wave signal S generated by the signal generating unit 10a to the one end of the fixing member 13 having a predetermined dielectric constant $\in$. The waveguide 23a described in FIGS. 1, 2A, 2B and 3 is provided to the coupling circuit 205 so as to be coupled to the fixing member 13 having the dielectric constant $\in$. If the coupling circuit 205 has a fractional bandwidth (=a signal band/an operating center frequency) of about 10% to about 20%, the coupling circuit 205 may be easily formed using a resonance structure and the like. In this embodiment, an electromagnetic wave S' of a millimeter wave propagates through the fixing member 13 having the dielectric constant $\in$ and a loss. Since the fixing member 13 has a large loss, reflection is attenuated.

The coupling circuit 207 constituting an example of the antenna coupling unit 102 is coupled to the fixing member 13 to convert the electromagnetic wave S' received from the other end of the fixing member 13 into the millimeter wave signal S. The coupling circuit 207 is provided with a waveguide 23b (not shown). The waveguide 23b has the same structure of the waveguide 23a as described with reference to FIGS. 1, 2A, 2B and 3, and is coupled to the other end of the fixing member 13 having the dielectric constant $\in$. In addition to the waveguide 23a or 23b, the coupling circuit 207 may be formed of an antenna member having a predetermined length, for example, about 600 μm based on the wavelength λ of the millimeter wave signal S. As the antenna member, a probe antenna (a dipole antenna and the like), a loop antenna, or a small aperture coupling element (a slot antenna and the like) is used.

The signal generating unit 10b is connected to the coupling circuit 207. In order to generate an output signal Sout by performing signal processing with respect to the millimeter wave signal S received in the coupling circuit 207, the signal generating unit 10b, for example, includes an amplifier 208, a second frequency conversion circuit 209 and a demodulation circuit 210. The amplifier 208 is connected to the coupling circuit 207 to amplify the received millimeter wave signal S.

The frequency conversion circuit 209 is connected to the amplifier 208 to frequency-convert the amplified millimeter wave signal S and output a frequency-converted output signal Sout. The demodulation circuit 210 is connected to the frequency conversion circuit 209 to demodulate the frequency-converted output signal Sout.

The above-described method of frequency-converting the input signal Sin and performing data transmission is generally used for broadcasting or wireless communication. In the above use, a relatively complicated transmitter, receiver and the like are used to cope with problems such as (1) to what extent communication is possible (a problem of S/N with respect to thermal noise), (2) how to cope with reflection and a multipath, and (3) how to suppress disturbance and interference with other channels.

Since the signal generating unit 10a and the signal generating unit 10b used in the first embodiment are used in a millimeter band of a frequency higher than a frequency used in a complicated transmitter, receiver and the like generally used in broadcasting or wireless communication, and have a short wavelength λ, they are advantageous in terms of the reuse of a frequency and suitable for performing communication among many devices in a neighborhood. In this embodiment, an example of the downlink data transmission path of the millimeter wave has been described. However, when configuring a bi-directional data transmission path, an uplink data transmission path of the millimeter wave is configured by providing a reception system to a transmission system of the in-millimeter-wave dielectric transmission device 100 shown in FIG. 4 and providing a transmission system to the reception system, so that the transmission system and the reception system may operate in a time division manner.

Figure 5:
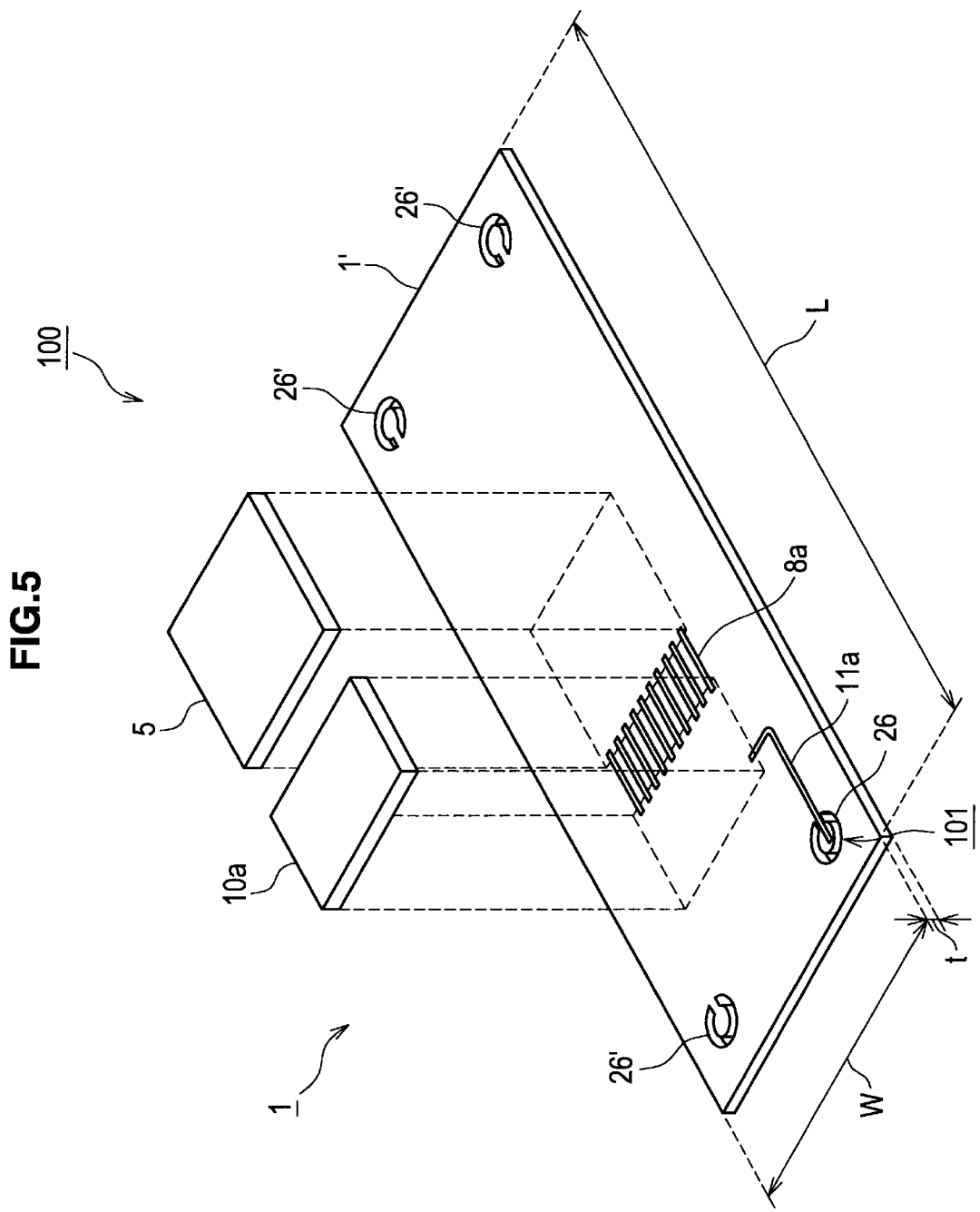
FIG. 5 is a process diagram showing an example (1) of forming a wireless transmission device 500.
Figure 6:
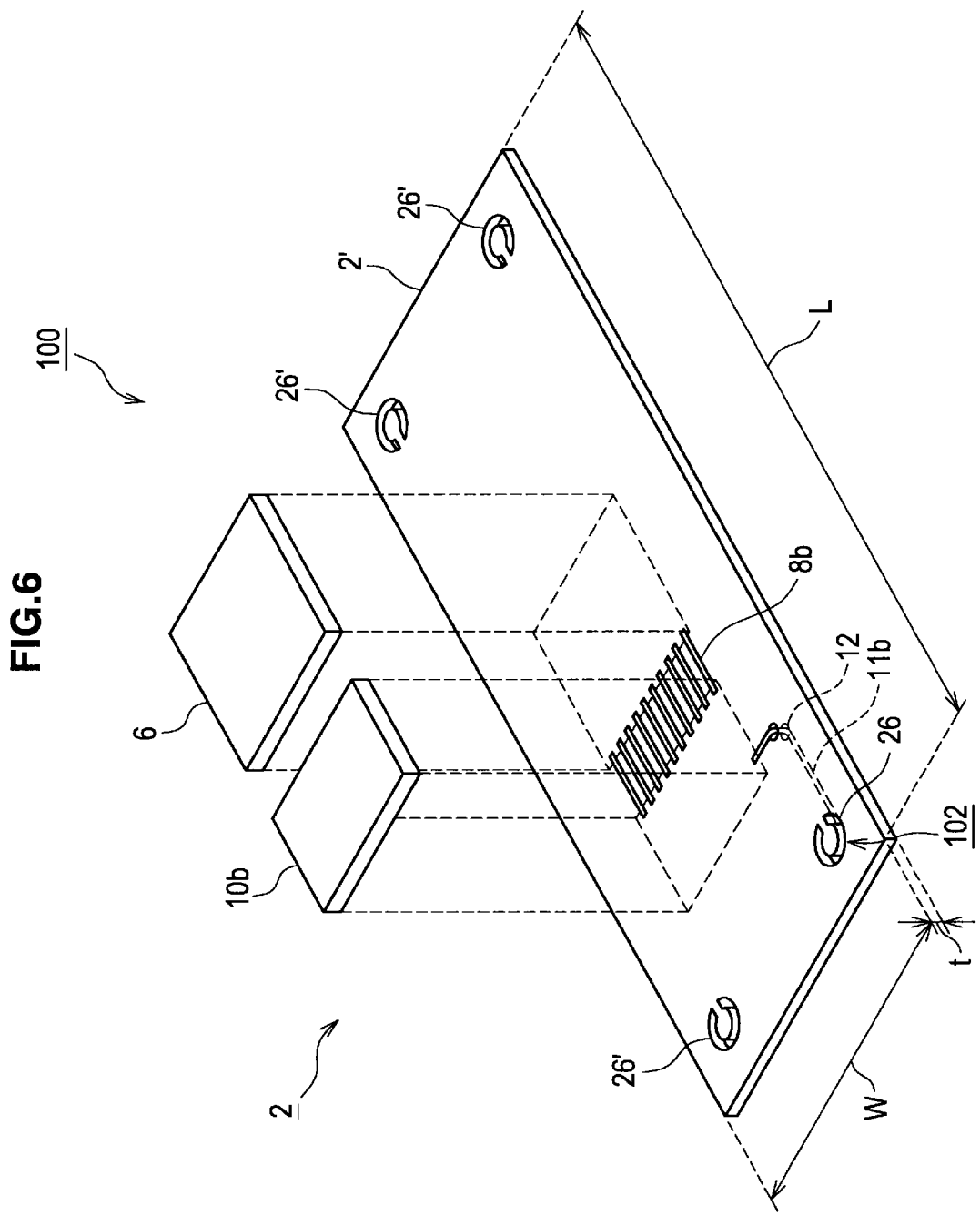
FIG. 6 is a process diagram showing an example (2) of forming a wireless transmission device 500.
Figure 7:
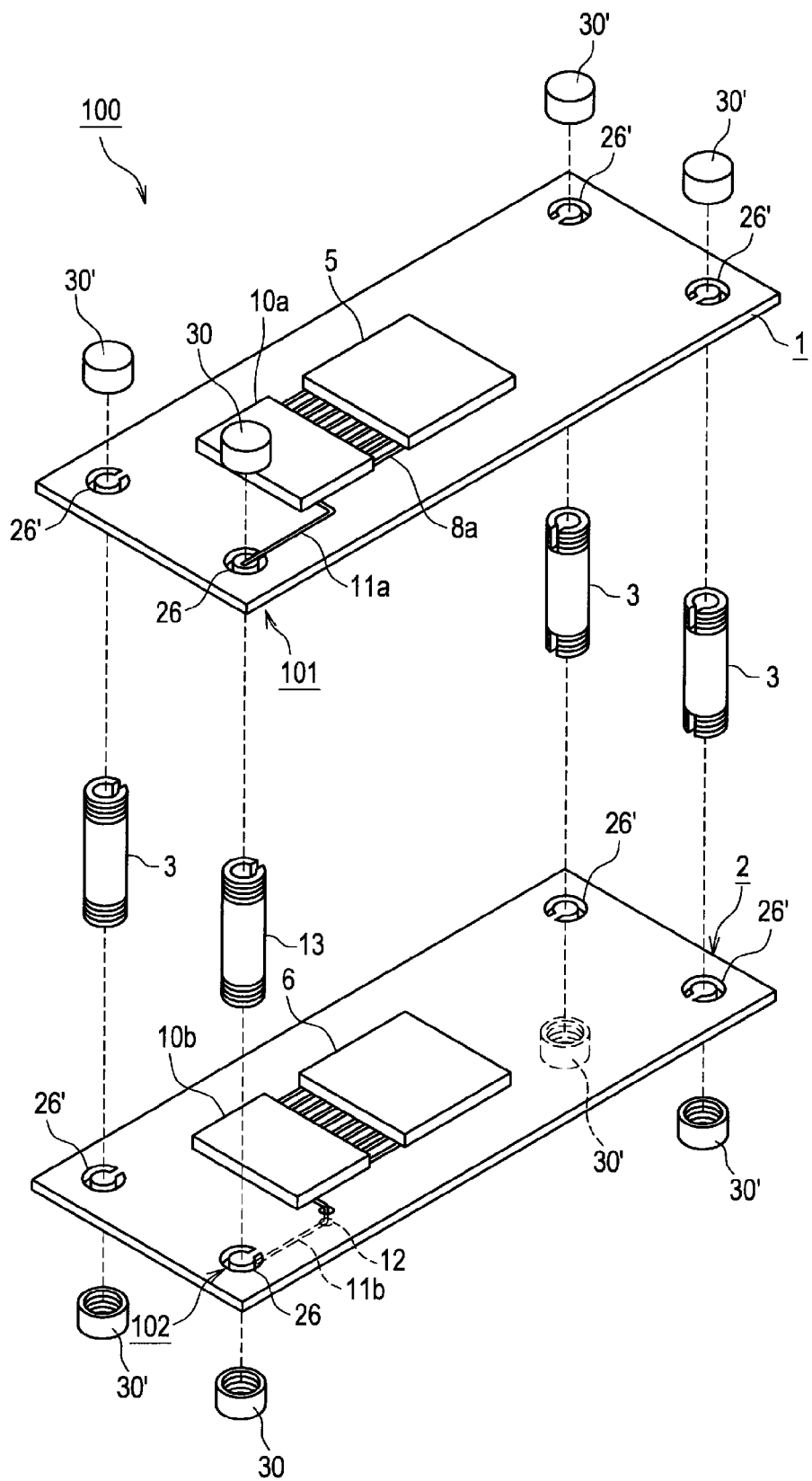
FIG. 7 is a process diagram showing an example (3) of forming a wireless transmission device 500.

Next, examples of forming the in-millimeter-wave dielectric transmission device 100 will be described with reference to FIGS. 5 to 7. FIGS. 5 to 7 are process diagrams showing the examples (1 to 3) of forming the in-millimeter-wave dielectric transmission device 100. They are based on the case of manufacturing the in-millimeter-wave dielectric transmission device 100 according to the first embodiment.

First, in FIG. 5, a board 1' is prepared in order to form the printed board 1 that processes a millimeter wave signal. For example, as the board 1', a double-sided copper foil board having the insulation layer 1a and the conductive layers 20 and 25 as shown in FIG. 2B may be used. The size of the board 1', for example, is defined as a length L, a width W and a thickness t (refer to FIG. 1).

The electrical wiring 8a, the transmission line 11a, the waveguide 23a, the four through holes 26 and the like are formed on and in the board 1'. The transmission line 11a and the waveguide 23a constitute the antenna coupling unit 101. The conductive layers 20 and 25 formed on both surfaces of the insulation layer 1a of the board 1' are used as a ground pattern. Next, the waveguide 23a is formed at one corner of the board 1'. In this embodiment, the waveguide 23a may not be formed at the other three corners. In other embodiments, the waveguide 23a may also be formed at the other three corners.

In relation to the waveguide 23a, an opening having a diameter D1 is opened in one corner of the board 1'. Then, a conductive member is provided to the inner wall of the opening to achieve conductivity, and the conductive layer 20 is electrically bonded to the conductive layer 25 by the conductor part 24 obtained through the process of achieving the conductivity. The conductor part 24 is formed as follows. For example, the opening having the diameter D1 is formed in order to connect the conductive layers 20 and 25 to each other, which achieve ground (earth) of the surface and rear surface of the printed board 1. The opening is formed along the circumference constituting the waveguide 23a. Thereafter, the opening is made conductive, so that a contact hole (a via hole) for a conductor part is formed. At the time of forming the waveguide, the contact hole has a hollow section. Then, a dielectric substance constituting the printed board 1 is filled therein. In addition, the inner side of the conductor part 24 may have a hollow section at the time of forming the waveguide.

After forming the waveguide 23a, an insulating film having a predetermined dielectric constant is formed on the entire surface of the conductive layer 20, thereby forming the transmission line layer 21 having a thickness t1. An insulating film is filled to be buried in the waveguide 23a. As the insulating film, the dielectric substance constituting the printed board 1 is used, and the dielectric substance is filled in the conductor part 24 to form a dielectric transmission path. The lower side surface of the waveguide 23a filled with the dielectric substance serves as the waveguide surface I (refer to FIG. 2B).

Thereafter, a conductive film is formed on the entire surface of the insulating film and is subject to patterning, thereby, for example, forming 10 electrical wirings 8a and one transmission line 11a having a line width W1 and serving as a microstrip line. The transmission line 11a is obtained by forming the line 22 having a line width W1 on the transmission line layer 21. At this time, the transmission line layer 21 is disposed such that the front end of the transmission line layer 21 is inserted into the waveguide 23a, and the transmission line 11a (the line 22) is patterned such that it is lengthened by the distance D3 from the center position of the waveguide 23a. By the patterning, it is possible to form the signal converting section 36 including the line 22 disposed to enter (be inserted into) the waveguide 23a. In the waveguide 23a, the signal converting section 36 is configured to convert a millimeter wave signal into an electromagnetic wave.

Then, one through hole 26 having a horseshoe shape and three through holes 26' having a horseshoe shape are opened in four corners of the board 1'. For example, the through holes 26 and 26' are opened using a press machine provided with a machining cutter having substantially a C shape at the front end thereof. The through hole 26 is used for the fitting of the fixing member 13 and the through holes 26' are used for the fitting of the three fixing members 3.

In addition to the transmission line 11a and the antenna coupling unit 101, the signal processing unit 5 and the signal generating unit 10a are mounted on the board 1'. As the signal processing unit 5, an IC device for signal processing such as compression of data of a movie image, a computer image and the like is used. As the signal generating unit 10a, an IC device for signal generation is used to generate a millimeter wave signal by performing signal processing with respect to an input signal. In this embodiment, the signal processing unit 5 and the signal generating unit 10a are bonded at a predetermined position on the board 1', so that the signal processing unit 5 is connected to the signal generating unit 10a by the 10 electrical wirings 8a, thereby achieving the printed board 1 that converts data of a movie image, a computer image and the like into a millimeter wave signal.

Next, in FIG. 6, a board 2' is prepared in order to form the printed board 2 that receives the millimeter wave signal from the printed board 1 and performs signal processing with respect to the millimeter wave signal. For example, as the board 2', a double-sided copper foil board having the insulation layer 1a and the conductive layers 20 and 25 as shown in FIG. 2B may be used. The size of the board 2' is also defined as a length L, a width W and a thickness t (refer to FIG. 1).

The electrical wiring 8b, the transmission lines 11b, the waveguide 23b, the four through holes 26 and the like are formed on and in the board 2'. The transmission line 11b and the waveguide 23b constitute the antenna coupling unit 101. The conductive layers 20 and 25 formed on both surfaces of the insulation layer 1b of the board 2' are used as a ground pattern. Next, the waveguide 23b is formed at one corner of the board 2'. In this embodiment, the waveguide 23b may not be formed at the other three corners. When forming the waveguide 23b, a contact hole 12 is formed to obtain a connection of the transmission lines 11b on the front and the back of the board 2'.

In relation to the waveguide 23b, an opening having a diameter D1 is opened in one corner of the board 2'. Then, a conductive member is provided to the inner wall of the opening to achieve conductivity, and the conductive layer 20 is electrically bonded to the conductive layer 25 by the conductor part 24 obtained through the process of achieving the conductivity. The conductor part 24 is formed in the same manner as the printed board 1.

In relation to the contact hole 12, an opening having a predetermined diameter is opened in a predetermined position of the board 2'. Then, a conductive member is provided to the inner wall of the opening to achieve conductivity, and it is possible to obtain a connection of the transmission lines 11b on the front and the back of the board 2' through the contact hole 12 obtained through the process of achieving the conductivity.

After forming the waveguide 23b and the contact hole 12, an insulating film having a predetermined dielectric constant is formed on the entire surface of the conductive layer 20, except for the formation position of the contact hole 12, thereby forming the transmission line layer 21 having a thickness t1. An insulating film is filled to be buried in the waveguide 23b. As the insulating film, the dielectric substance constituting the printed board 2 is used, and the dielectric substance is filled in the conductor part 24 to form a dielectric transmission path. The lower side surface of the waveguide 23b filled with the dielectric substance serves as the waveguide surface I (refer to FIG. 2B).

Thereafter, a conductive film is formed on the entire surface of the insulating film and is subject to patterning, thereby, for example, forming 10 electrical wirings 8b and one transmission line 11b having a line width W1 and serving as a microstrip line of the surface side of the printed board 2. The transmission line 11b is obtained by forming the line 22 having a line width W1 on the transmission line layer 21. The transmission line 11b on the front is connected to the contact hole 12 formed in the surface of the board 2'.

In addition, an insulating film having a predetermined dielectric constant is formed on the entire surface of the conductive layer 25, except for the formation position of the contact hole 12 of the rear surface, thereby forming the transmission line layer 21 having a thickness t1 on the rear surface side of the printed board 2. As the insulating film, the dielectric substance constituting the printed board 2 is used. At this time, the transmission line 11b on the back is also obtained by forming the line 22 having a line width W1 on the transmission line layer 21. The transmission line 11b on the back is connected to the contact hole 12 formed in the rear surface of the board 2'. Thus, the transmission line 11b on the front reaches the rear surface of the board 2' from the surface of the board 2' via the contact hole 12 and is connected to the transmission line 11b on the back.

Furthermore, the transmission line 11b on the back is disposed such that the front end of the transmission line 11b is inserted into the waveguide 23b, and the transmission line 11b (the line 22) is patterned such that it is lengthened by the distance D3 from the center position of the waveguide 23b. By the patterning, it is possible to form the signal converting section 36 including the line 22 disposed to enter (be inserted into) the waveguide 23b. In the waveguide 23b, the signal converting section 36 is configured to convert an electromagnetic wave into a millimeter wave signal.

Then, one through hole 26 having a horseshoe shape and three through holes 26' having a horseshoe shape are opened in the four corners of the board 2', in the same manner as the first printed board 1. The through hole 26 is used for the fitting of the fixing member 13 and the through holes 26' are used for the fitting of the three fixing members 3. In addition to the transmission line 11b and the antenna coupling unit 101, the signal processing unit 6 and the signal generating unit 10b are mounted on the board 2'.

As the signal processing unit 6, an IC device for signal processing such as expansion of data of a movie image, a computer image and the like is used. As the signal generating unit 10b, an IC device for signal generation is used to generate an output signal by performing signal processing with respect to a millimeter wave signal. In this embodiment, the signal processing unit 6 and the signal generating unit 10b are bonded at a predetermined position on the board 2', so that the signal processing unit 6 is connected to the signal generating unit 10b by the 10 electrical wirings 8b, thereby achieving the printed board 2 that converts the millimeter wave signal transmitted from the printed board 1 into data of a movie image, a computer image and the like.

After preparing the above-described printed board 1 and printed board 2, the fixing member 13 having a predetermined dielectric constant is provided between the printed board 1 and the printed board 2 to form the dielectric transmission path while supporting the printed board 1 and the printed board 2 by the fixing member 13. As the fixing member 3 and the fixing member 13, for example, a resultant obtained by injection-molding resin having a predetermined dielectric constant is used such that the cutout part 37 is formed at both ends of the fixing member 13.

As dielectric transmission path termination parts 30 and fixing member termination stop parts 30', for example, a resultant obtained by performing metal plating with respect to the resultant obtained by injection-molding the resin having a predetermined dielectric constant is used, which has a shape described in FIG. 3. Of course, it may also be possible to use a resultant obtained by processing a metal bar into a cover-like shape and then performing female thread processing with respect to the inner surface side of the metal bar.

In this embodiment, the three fixing members 3 and the one fixing member 13 on the printed board 2 are fitted into three fixing member termination stop parts 30' and one dielectric transmission path termination part 30 below the printed board 2 and three fixing member termination stop parts 30' and one dielectric transmission path termination part 30 on the printed board 1, respectively.

For example, the three fixing members 3 are fitted into the three through holes 26 formed in the printed board 2 from the surface side and are fixed at the rear surface side using the three fixing member termination stop parts 30', respectively. In addition, one fixing member 13 is fitted into the through hole 26 constituting one antenna coupling unit 102 of the printed board 2 from the surface side and are fixed at the rear surface side using the one dielectric transmission path termination part 30. Consequently, the four fixing members 3 and 13 can be fitted with the printed board 2.

Furthermore, the three fixing members 3 on the printed board 2 are fitted into the three through holes 26' formed in the printed board 1 from the rear surface side and are fixed at the surface side using the three fixing member termination stop parts 30', respectively. In addition, the one fixing member 13 is fitted into the through hole 26 constituting the one antenna coupling unit 101 of the printed board 1 from the rear surface side and is fixed at the surface side using the one dielectric transmission path termination part 30. Consequently, the four fixing members 3 and 13 on the printed board 2 can be fitted with the printed board 1, thereby completing the fabrication of the in-millimeter-wave dielectric transmission device 100.

As described above, when forming the in-millimeter-wave dielectric transmission device 100 such that the printed board 1 is supported by the three fixing members 3 and the one fixing member 13 on the printed board 2, it is possible to fabricate the in-millimeter-wave dielectric transmission device 100 in which the fixing member 13 constitutes the dielectric transmission path and an electromagnetic wave based on a millimeter wave received from the one end of the fixing member 13 can be transmitted to the other end of the fixing member 13.

Figure 8:
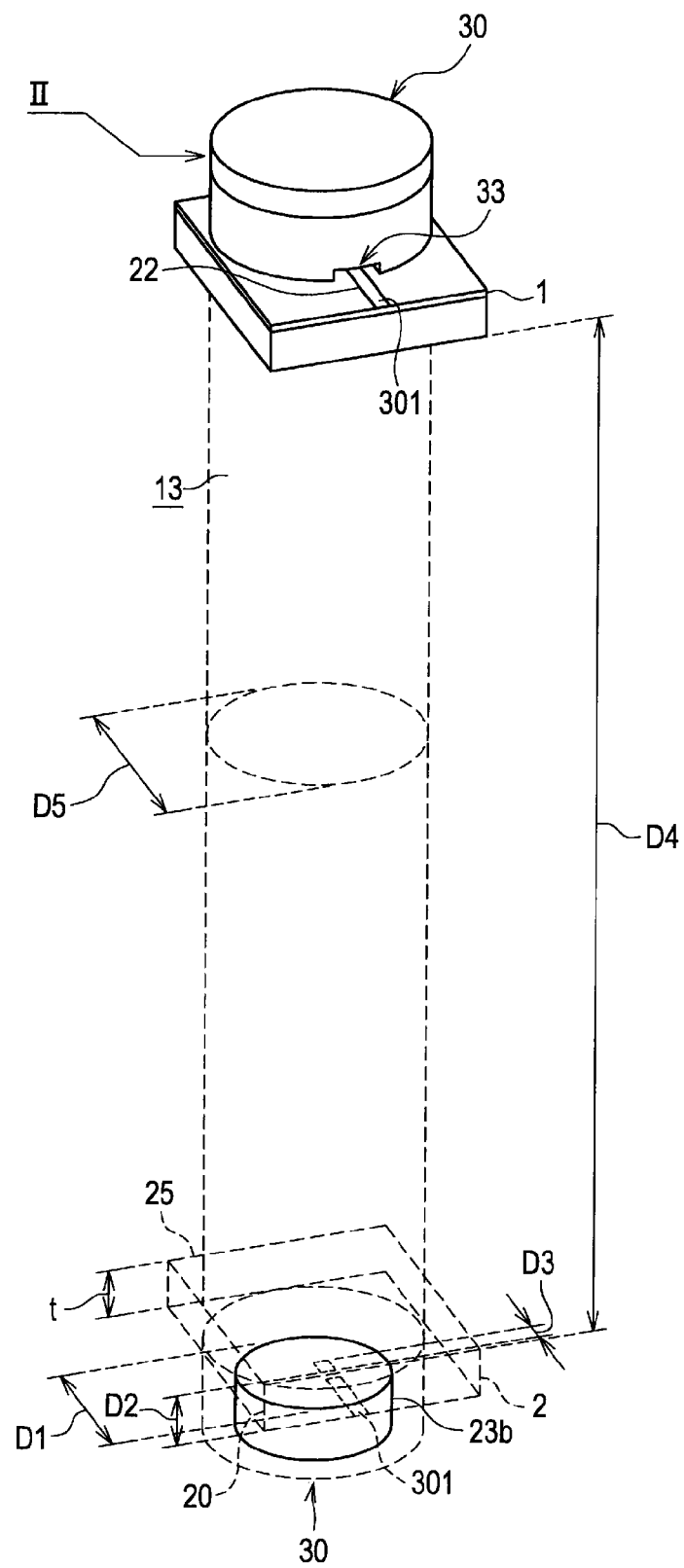
FIG. 8 is a perspective view showing an example of a simulation model of a wireless transmission device 500.

Next, a case where a fixing member 13 made of a general plastic material is applied to the in-millimeter-wave dielectric transmission device 100 will be described based on a result obtained by simulating a pass characteristic (size of loss) and a reflection characteristic of the fixing member 13 using the CST MW-STUDIO. FIG. 8 is a perspective view showing an example of a simulation model of the in-millimeter-wave dielectric transmission device 100. As the fixing member 13, a general plastic material is assumed. However, the plastic material contains glass epoxy-based, acryl-based and polyethylene-based resin materials.

In addition, except for the conductive layer 20 and the transmission line layer 21, the insulation layer 1a and the conductive layers 20 and 25 of the printed board 1 are excluded from the simulation model because they do not significantly influence the characteristics. The fixing member 13, the printed board 2 and the dielectric transmission path termination part 30 are transparently displayed (skeleton view) for the purpose of convenience.

According to the example of the simulation model of the in-millimeter-wave dielectric transmission device 100 shown in FIG. 8, the antenna coupling unit 101 and the antenna coupling unit 102 are configured to be connected to each other through the fixing member 13. As the antenna coupling unit 101, a model having the waveguide 23a and the signal converting section 36 shown in FIGS. 1 and 3 is used. The signal converting section 36 converts a millimeter wave signal into an electromagnetic wave and radiates the electromagnetic wave in the fixing member 13. As the waveguide 23a, a model having a horseshoe shape at the inner side of the through hole 26 opened in the printed board 2 is used.

The fixing member 13 is modeled such that the fixing member 13 is fitted into the through hole 26 opened in the outer peripheral portion of the waveguide 23a, and the printed board 1 and the one end of the fixing member 13 are fixed via the dielectric transmission path termination part 30. As the dielectric transmission path termination part 30 fixing the one end of the fixing member 13, a model having the gap part 33 at a position at which the transmission line 11a crosses the waveguide 23a is used. When providing the gap part 33 as described above, it is possible to avoid a contact between the one end of the fixing member 13 constituting the dielectric transmission path and the transmission line 11a and a contact between the other end of the fixing member 13 and the transmission line 11a.

The antenna coupling unit 101 is simulated such that the antenna coupling unit 101 converts a millimeter wave signal into an electromagnetic wave at the one end of the fixing member 13 constituting the dielectric transmission path and radiates the electromagnetic wave to the fixing member 13. For example, the antenna coupling unit 101 has the dielectric transmission path termination part 30, and is configured to reflect the electromagnetic wave, which has been converted into the millimeter wave signal by the signal converting section 36 and is not supplied to the one end of the fixing member 13, and to fix the one end of the fixing member 13 to the printed board 1.

An object having the second waveguide 23b and the second signal converting section 36 is applied to the antenna coupling unit 102. The second signal converting section 36 of the antenna coupling unit 102 converts the electromagnetic wave having been propagated through the fixing member 13 into a millimeter wave signal. The waveguide 23b is formed to have a horseshoe shape at the inner side of the through hole 26 opened in the printed board 2 (refer to FIGS. 2A and 2B).

The antenna coupling unit 102 is a simulation model which is configured to convert the electromagnetic wave having been propagated to the other end of the fixing member 13 constituting the dielectric transmission path into the millimeter wave signal by the signal converting section 36, transmit the millimeter wave signal to the transmission line 11b via the waveguide 23b, and fix the printed board 2 and the other end of the fixing member 13 by the through hole 26 forming the waveguide 23b.

For example, the antenna coupling unit 102 has the dielectric transmission path termination part 30 constituting an example of a second fixing means, and is configured to reflect the electromagnetic wave, which has been propagated to the other end of the fixing member 13 and has not been converted into the millimeter wave signal by the signal converting section 36, and fix the other end of the fixing member 13 to the printed board 2.

The dielectric transmission path termination part 30 fixing the other end of the fixing member 13 has a second gap part (not shown) at a position at which the transmission line 11b crosses the waveguide 23b (refer to FIG. 2B). When providing the gap part as described above, it is possible to avoid a contact between the one end of the fixing member 13 constituting the dielectric transmission path and the transmission line 11b and a contact between the other end of the fixing member 13 and the transmission line 11b. In this way, the simulation model of the in-millimeter-wave dielectric transmission device 100 is configured.

Next, parameters provided to the simulation model of the in-millimeter-wave dielectric transmission device 100 shown in FIG. 8 will be described. At the time of the simulation, parameters are as follows. The thickness (hereinafter, simply referred to as a thickness t of a board) of the printed board 1 and the printed board 2 is 1.0 mm. The diameter D1 of the waveguide 23a is 2.5 mm. The thickness t1 of the transmission line layer 21 is 0.1 mm. The distance D2 between the printed board 1 and the ceiling surface II is 1.25 mm. The opening width W2 of the gap part 33 is 0.8 mm. The line width W1 of the line 22 is 0.2 mm. The distance D3 from the center position of the waveguide 23a to the end portion of the line 22 is 0.9 mm. When the separation distance between the printed board 1 and the printed board 2 is defined as an inter-board distance D4, the inter-board distance D4 is 20 mm.

When the diameter of the fixing member 13 is defined as D5, the diameter D5 is 4.0 mm. The specific dielectric constants ∈r of the printed board 1 and the printed board 2 are 3.5. The dielectric loss tangents tan δ of the printed board 1 and the printed board 2 are 0.005. δ denotes a loss angle of a dielectric substance. The specific dielectric constant ∈r of the fixing member 13 is 3.0. The dielectric loss tangent tan δ of the fixing member 13 is 0.003. Table 1 shows the values of the parameters at the time of the simulation

TABLE 1

| Parameter | Value | Unit |
| --- | --- | --- |
| Thickness t of board | 1.0 | mm |
| Diameter D1 of waveguide | 2.5 | mm |
| Thickness t1 of transmission line layer | 0.1 | mm |
| Distance D2 between board and ceiling surface II | 1.25 | mm |
| Opening width W2 of gap part 33 | 0.8 | mm |
| Line width W1 of line 22 | 0.2 | mm |
| Distance D3 from center position of waveguide to end portion of line 22 | 0.9 | mm |
| Inter-board distance D4 | 20 | mm |
| Diameter D5 of fixing member 13 | 4.0 | mm |
| Specific dielectric constant of board | 3.5 | none |
| Dielectric loss tangent tan δ of board (1 GHz) | 0.005 | none |
| Specific dielectric constant of fixing member 13 | 3.0 | none |
| Dielectric loss tangent tan δ of fixing member 13 (1 GHz) | 0.003 | none |

Figure 9:
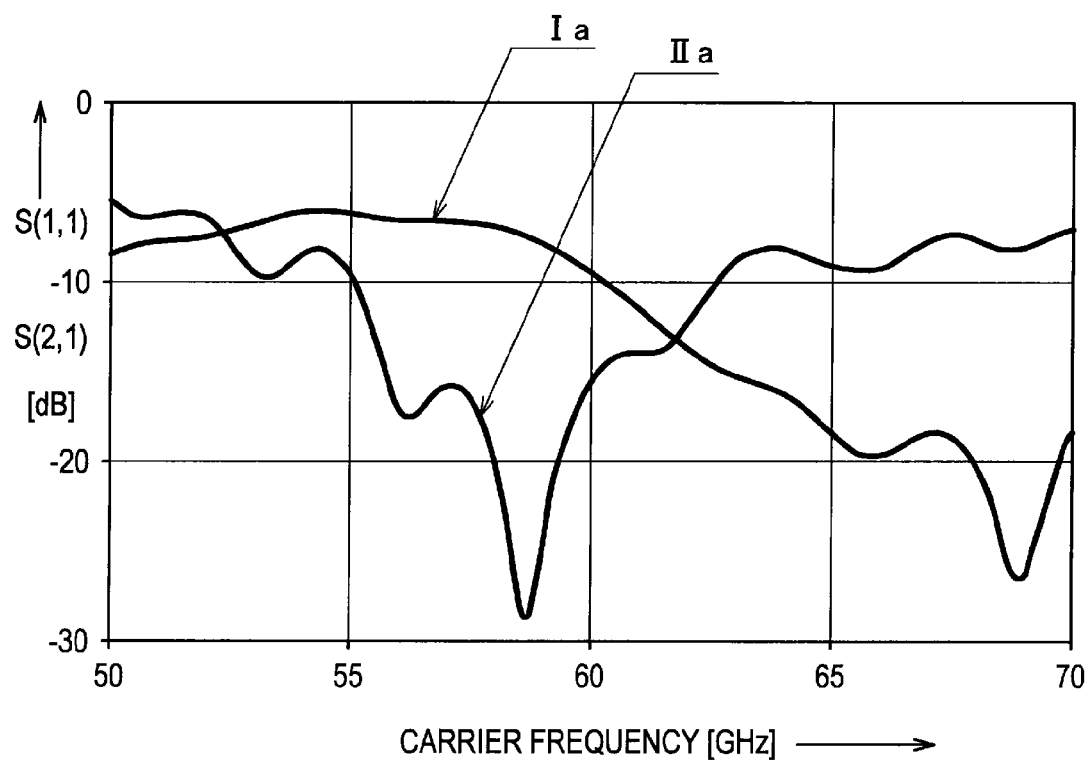
FIG. 9 is a graph showing an example of a simulation characteristic of a wireless transmission device 500.

FIG. 9 is a graph showing an example of a simulation characteristic of the in-millimeter-wave dielectric transmission device 100. The example of the simulation characteristics of the in-millimeter-wave dielectric transmission device 100 shown in FIG. 9 shows an example of a pass characteristic and an example of a reflection characteristic between ports 301 which are provided on the line 22 of the printed board 1 and the line 22 of the printed board 2 shown in FIG. 8.

In FIG. 9, a vertical axis denotes a pass characteristic S (2, 1) dB and a reflection characteristic S (1, 1) dB. A horizontal axis denotes a carrier frequency (GHz) and a scale is in units of 5 GHz. In FIG. 9, Ia denotes the example of the pass characteristic and is a frequency characteristic figure showing the example of the pass characteristic and the example of the reflection characteristic of the fixing member 13 when the transmission lines 11a an 11b are formed of a microstrip line, the antenna coupling unit 101 is formed of the waveguide 23a, and the antenna coupling unit 102 is formed of the waveguide 23b.

The pass characteristic S (2, 1) dB of the fixing member 13 is a pass characteristic of the millimeter wave signal S transmitted from the transmission line 11a of the printed board 1 having the dielectric loss tangent tan δ of 0.005 to the transmission line 11b of the printed board 2 having the same dielectric loss tangent tan δ of 0.005 through the fixing member 13 having the dielectric loss tangent tan δ of 0.003. The pass characteristic S (2, 1) dB corresponds to a case where the carrier frequency is in the range of 50 GHz to 70 GHz and increased in units of 1 GHz. According to the simulation result, video data based on the millimeter wave signal S has passing loss of about 7.4 dB when the carrier frequency is 58.7 GHz between the ports 301.

Furthermore, In FIG. 9, IIa denotes the example of the reflection characteristic of the fixing member 13 and the reflection characteristic S (1, 1) dB of the fixing member 13 is a reflection characteristic of the millimeter wave signal S transmitted from the transmission line 11a of the printed board 1 having the dielectric loss tangent tan δ of 0.005 to the transmission line 11b of the printed board 2 having the same dielectric loss tangent tan δ of 0.005 through the fixing member 13 having the dielectric loss tangent tan δ of 0.003.

The reflection characteristic S (1, 1) dB corresponds to a case where the carrier frequency is in the range of 50 GHz to 70 GHz and increased in units of 1 GHz. According to the simulation result, reflection loss is equal to or less than −15 dB. Furthermore, in the range in which the carrier frequency is 55.0 GHz to 62.5 GHz, reflection loss is equal to or less than −10 dB.

In the fixing member 13 having large loss as described above, since transmission loss is increased and a reflected wave is attenuated with an increase in the carrier frequency, it is also possible to reduce adverse effect of a standing wave due to the reflected wave. In this embodiment, the frequency conversion circuits 203 and 209 frequency-convert the input signal Sin into the millimeter wave signal S, so that the ratio of (a signal band)/(a center frequency) can be reduced and thus the signal generating unit 10*a* for transmitting a millimeter wave signal and the signal generating unit 10*b* for receiving a millimeter wave signal can also be easily configured.

According to the in-millimeter-wave dielectric transmission device 100 and the manufacturing method thereof in accordance with the first embodiment as described above, the fixing member 13 having a predetermined dielectric constant is provided between the printed board 1 including the signal generating unit 10*a* and the antenna coupling unit 101 to process the millimeter wave signal S and the printed board 2 including the antenna coupling unit 102 and the signal generating unit 10*b* to perform signal processing with respect to the received millimeter wave signal S, constitutes a dielectric transmission path, and supports the printed board 1 and the printed board 2 together with the other three fixing members 3.

With such a structure, the electromagnetic wave S' based on the millimeter wave signal S radiated from the one end of the fixing member 13 constituting the dielectric transmission path can be received at the other end of the fixing member 13. Consequently, since the original support structure of the fixing member 13 is used as a signal transmission path, it is possible to remove a communication cable, a connector and the like for connecting the printed board 1 to the printed board 2 according to the related art. In addition, support and high speed data transmission between the printed board 1 and the printed board 2 are performed by the fixing member 13 which is the same support member. Since the high speed data transmission in the fixing member 13 is performed by a millimeter wave (an electromagnetic wave), the fixing member 13 constituting the dielectric transmission path is finished with a single material. Thus, processing demanding accuracy as with an optical waveguide is not necessary.

Moreover, at the time of the fixing between the printed board 1 and the fixing member 13 in the antenna coupling unit 101, strictness of position adjustment for stably performing data transmission is not necessary, unlike the case of employing an optical transmission method. According to the in-millimeter-wave dielectric transmission device 100, it is possible to perform support and high speed data transmission between the printed boards 1 and 2 with a simple and inexpensive configuration, resulting in the improvement of reliability of data transmission against vibration and deviation.

Second Embodiment

Figure 10:
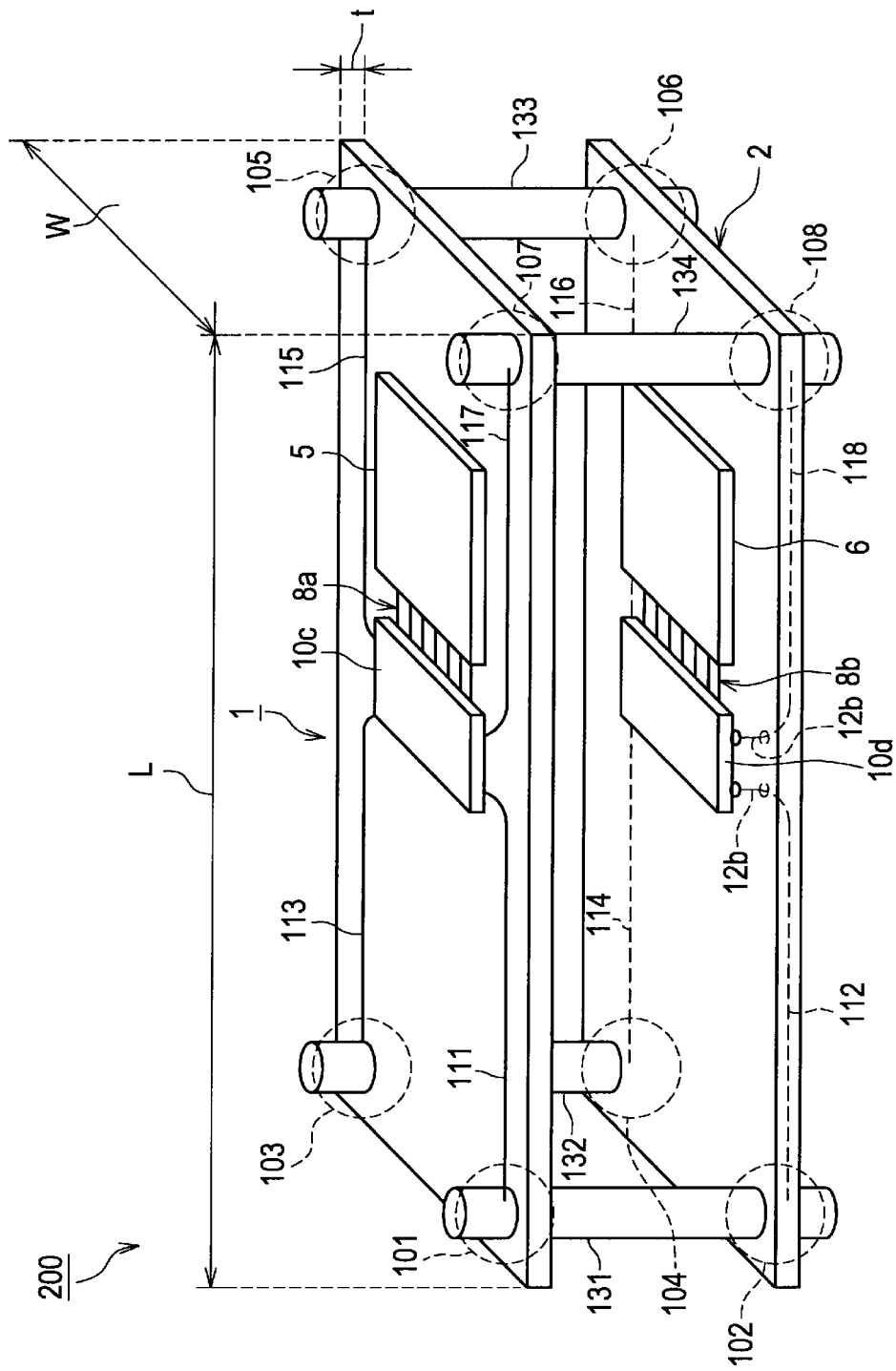
FIG. 10 is a perspective view showing an example of the configuration of an in-millimeter-wave dielectric transmission device 200 as a second embodiment.

FIG. 10 is a perspective view showing an example of the configuration of an in-millimeter-wave dielectric transmission device 200 as the second embodiment. In this embodiment, a millimeter wave signal S is transmitted in parallel through fixing members 131 to 134 provided at four corners (plural) of printed boards 1 and 2 and the like (bus configuration).

The in-millimeter-wave dielectric transmission device 200 shown in FIG. 10 can be applied to a millimeter wave video data transmission device, a millimeter wave video data transmission system and the like, which convert data of a movie image, a computer image and the like into a plurality of millimeter wave signals S and transmit the millimeter wave signals at a high speed, and have a carrier frequency of 30 GHz to 300 GHz for carrying the millimeter wave signals.

In this embodiment, four fixing members 13 constituting the dielectric transmission path as described in the first embodiment are provided between the printed board 1 and the printed board 2. Hereinafter, the four fixing members will be referred to as fixing members 131 to 134. Each of the fixing members 131 to 134 supports the printed board 1 and the printed board 2 and transmits the millimeter wave signals S. The fixing members 131 to 134 are provided between the printed board 1 and the printed board 2 while having a predetermined dielectric constant.

As the fixing members 131 to 134, a dielectric material at least including a glass epoxy-based, acryl-based, polyethylene-based resin is used. When configuring the in-millimeter-wave dielectric transmission device 200 in this way, it is possible to increase transmission capacity of video data based on the millimeter wave signals S four times as compared with the first embodiment.

The printed board 1 includes a signal processing unit 5, a signal generating unit 10*c*, antenna coupling units 101, 103, 105 and 107 of four systems, and four transmission lines 111, 113, 115 and 117, which are mounted thereon. Similarly to the first embodiment, the signal processing unit 5 performs a process such as compression with respect to data of a movie image, a computer image and the like based on a predetermined standard to output an electrical signal (hereinafter, referred to as an input signal).

The signal processing unit 5 is connected to an electrical wiring 8*a* such as a wiring pattern. The electrical wiring 8*a* is connected to the signal generating unit 10*c*. Unlike the first embodiment, the signal generating unit 10*c* performs signal processing with respect to the input signal to generate a plurality of (in this embodiment, four systems) millimeter wave signals. The signal generating unit 10*c*, for example, is configured by providing the signal generating unit 10*a*, which is described in the first embodiment, in a row by four systems.

In this embodiment, the four transmission lines 111, 113, 115 and 117 are drawn out from the signal generating unit 10*c*. A scheme of a strip line, a microstrip line, a coplanar line, a slot line and the like is applied to the transmission lines 111, 113, 115 and 117 on the printed board 1.

The transmission line 111 is provided at a first corner part (corner) of the printed board 1. The transmission line 111 is bonded between the signal generating unit 10*a* constituting the first system at the signal generating unit 10*c* and the antenna coupling unit 101. The fixing member 131 is connected to the antenna coupling unit 101. The antenna coupling unit 101 couples a millimeter wave signal, which is transmitted from the signal generating unit 10*c* via the transmission line 111, to one end of the fixing member 131. In this embodiment also, the antenna coupling unit 101 converts the millimeter wave signal into an electromagnetic wave and radiates the electromagnetic wave into the fixing member 131 constituting a dielectric transmission path.

The fixing member 131 not only constitutes a dielectric transmission path but also supports the printed board 1 and the printed board 2 together with the other three fixing members 132 to 134. The support function includes a case where the printed board 2 holds up and supports the printed board 1 and a case where the printed board 1 is suspended and supports the printed board 2, in the same manner as that in the first embodiment.

Furthermore, the transmission line 113 is provided at a second corner part of the printed board 1. The transmission line 113 is bonded to the antenna coupling unit 103 of the second system. The transmission line 113 is bonded between the signal generating unit 10a constituting the second system at the signal generating unit 10c and the antenna coupling unit 103. The fixing member 132 is connected to the antenna coupling unit 103. The antenna coupling unit 103 couples a millimeter wave signal, which is transmitted from the signal generating unit 10c via the transmission line 113, to one end of the fixing member 132.

In this embodiment also, the antenna coupling unit 103 converts the millimeter wave signal into an electromagnetic wave and radiates the electromagnetic wave into the fixing member 132 constituting a dielectric transmission path. The fixing member 132 not only constitutes a dielectric transmission path but also supports the printed board 1 and the printed board 2 together with the other three fixing members 131, 133 and 134.

In addition, the transmission line 115 is provided at a third corner part of the printed board 1. The transmission line 115 is bonded to the antenna coupling unit 105 of the third system. The transmission line 115 is bonded between the signal generating unit 10a constituting the third system at the signal generating unit 10c and the antenna coupling unit 105. The fixing member 133 is connected to the antenna coupling unit 105. The antenna coupling unit 105 couples a millimeter wave signal, which is transmitted from the signal generating unit 10c via the transmission line 115, to one end of the fixing member 133.

In this embodiment also, the antenna coupling unit 105 converts the millimeter wave signal into an electromagnetic wave and radiates the electromagnetic wave into the fixing member 133 constituting a dielectric transmission path. The fixing member 133 not only constitutes a dielectric transmission path but also supports the printed board 1 and the printed board 2 together with the other three fixing members 131, 132 and 134.

Moreover, the transmission line 117 is provided at a fourth corner part of the printed board 1. The transmission line 117 is bonded to the antenna coupling unit 107 of the fourth system. The transmission line 117 is bonded between the signal generating unit 10a constituting the fourth system at the signal generating unit 10c and the antenna coupling unit 107. The fixing member 134 is connected to the antenna coupling unit 107. The antenna coupling unit 107 couples a millimeter wave signal, which is transmitted from the signal generating unit 10c via the transmission line 117, to one end of the fixing member 134.

In this embodiment also, the antenna coupling unit 107 converts the millimeter wave signal into an electromagnetic wave and radiates the electromagnetic wave into the fixing member 134 constituting a dielectric transmission path. The fixing member 134 not only constitutes a dielectric transmission path but also supports the printed board 1 and the printed board 2 together with the other three fixing members 131 to 133.

Meanwhile, the printed board 2, which receives the millimeter wave signals of the four systems and performs signal processing with respect to the millimeter wave signals, includes antenna coupling units 102, 104, 106 and 108 of four systems, four transmission lines 112, 114, 116 and 118, a signal generating unit 10d, and a signal processing unit 6, which are mounted thereon. In this embodiment, the four transmission lines 112, 114, 116 and 118 drawn out from the antenna coupling units 102, 104, 106 and 108 of the four systems are connected to the signal generating unit 10d. A scheme of a strip line, a microstrip line, a coplanar line, a slot line and the like is applied to the transmission lines 112, 114, 116 and 118 on the front and the back of the printed board 2.

The other end of the above-described fixing member 131 is bonded to the antenna coupling unit 102 provided at the first corner part of the printed board 2. The antenna coupling unit 102 receives an electromagnetic wave from the fixing member 131 and converts the electromagnetic wave into a millimeter wave signal. The millimeter wave signal is output to the signal generating unit 10d through the transmission line 112. The other end of the fixing member 132 is bonded to the antenna coupling unit 104 provided at the second corner part of the printed board 2. The antenna coupling unit 104 receives an electromagnetic wave from the fixing member 132 and converts the electromagnetic wave into a millimeter wave signal. The millimeter wave signal is output to the signal generating unit 10d through the transmission line 114.

Furthermore, the other end of the fixing member 133 is bonded to the antenna coupling unit 106 provided at the third corner part of the printed board 2. The antenna coupling unit 106 receives an electromagnetic wave from the fixing member 133 and converts the electromagnetic wave into a millimeter wave signal. The millimeter wave signal is output to the signal generating unit 10d through the transmission line 116. The other end of the fixing member 134 is bonded to the antenna coupling unit 108 provided at the fourth corner part of the printed board 2. The antenna coupling unit 108 receives an electromagnetic wave from the fixing member 134 and converts the electromagnetic wave into a millimeter wave signal. The millimeter wave signal is output to the signal generating unit 10d through the transmission line 118.

Unlike the first embodiment, the signal generating unit 10d receives the respective millimeter wave signals, which are received in the antenna coupling units 102, 104, 106 and 108 of the four systems, through the four transmission lines 112, 114, 116 and 118, and generates an output signal by performing signal processing with respect to the respective millimeter wave signals which are input via the transmission lines 112, 114, 116 and 118. The signal generating unit 10d, for example, is configured by providing the signal generating unit 10b, which is described in the first embodiment, in a row by four systems.

The signal processing unit 6 is connected to the signal generating unit 10d through an electrical wiring 8b such as a wiring pattern. The signal processing unit 6 performs a process such as expansion with respect to the output signal, which is generated by the signal generating unit 10d, based on a predetermined standard, thereby achieving data of a movie image, a computer image and the like. In this way, the in-millimeter-wave dielectric transmission device 200 is configured. In addition, since an example of forming the in-millimeter-wave dielectric transmission device 200 may employ the examples (1 to 3) of forming the in-millimeter-wave dielectric transmission device 100 shown in FIGS. 5 to 7 by replacing reference numerals, detailed description thereof will be omitted.

As described above, according to the in-millimeter-wave dielectric transmission device 200 as the second embodiment, the signal transmission lines of the four systems including the fixing members 131 to 134 are formed at the four corners of each of the printed board 1 and the printed board 2. According to the above-described downlink data transmission path of the millimeter wave, first data transmission using a millimeter wave signal as a medium is performed via the signal processing unit 5 of the printed board 1→the signal generating unit 10c→the transmission line 111→the antenna coupling unit 101→the fixing member 131→the antenna coupling unit 102→the transmission line 112→the signal generating unit 10d→the signal processing unit 6.

Similarly, second data transmission using a millimeter wave signal as a medium is performed via the signal processing unit 5 of the printed board 1→the signal generating unit 10*c*→the transmission line 113→the antenna coupling unit 103→the fixing member 132→the antenna coupling unit 104→the transmission line 114→the signal generating unit 10*d*→the signal processing unit 6. Third data transmission using a millimeter wave signal as a medium is performed via the signal processing unit 5 of the printed board 1→the signal generating unit 10*c*→the transmission line 115→the antenna coupling unit 105→the fixing member 133→the antenna coupling unit 106→the transmission line 116→the signal generating unit 10*d*→the signal processing unit 6.

Fourth data transmission using a millimeter wave signal as a medium is performed via the signal processing unit 5 of the printed board 1→the signal generating unit 10*c*→the transmission line 117→the antenna coupling unit 107→the fixing member 134→the antenna coupling unit 108→the transmission line 118→the signal generating unit 10*d*→the signal processing unit 6. Since the above-described first to fourth data transmission can be performed, it is possible to increase transmission capacity of video data and the like based on the millimeter wave signals four times as compared with the first embodiment.

Third Embodiment

Figure 11:
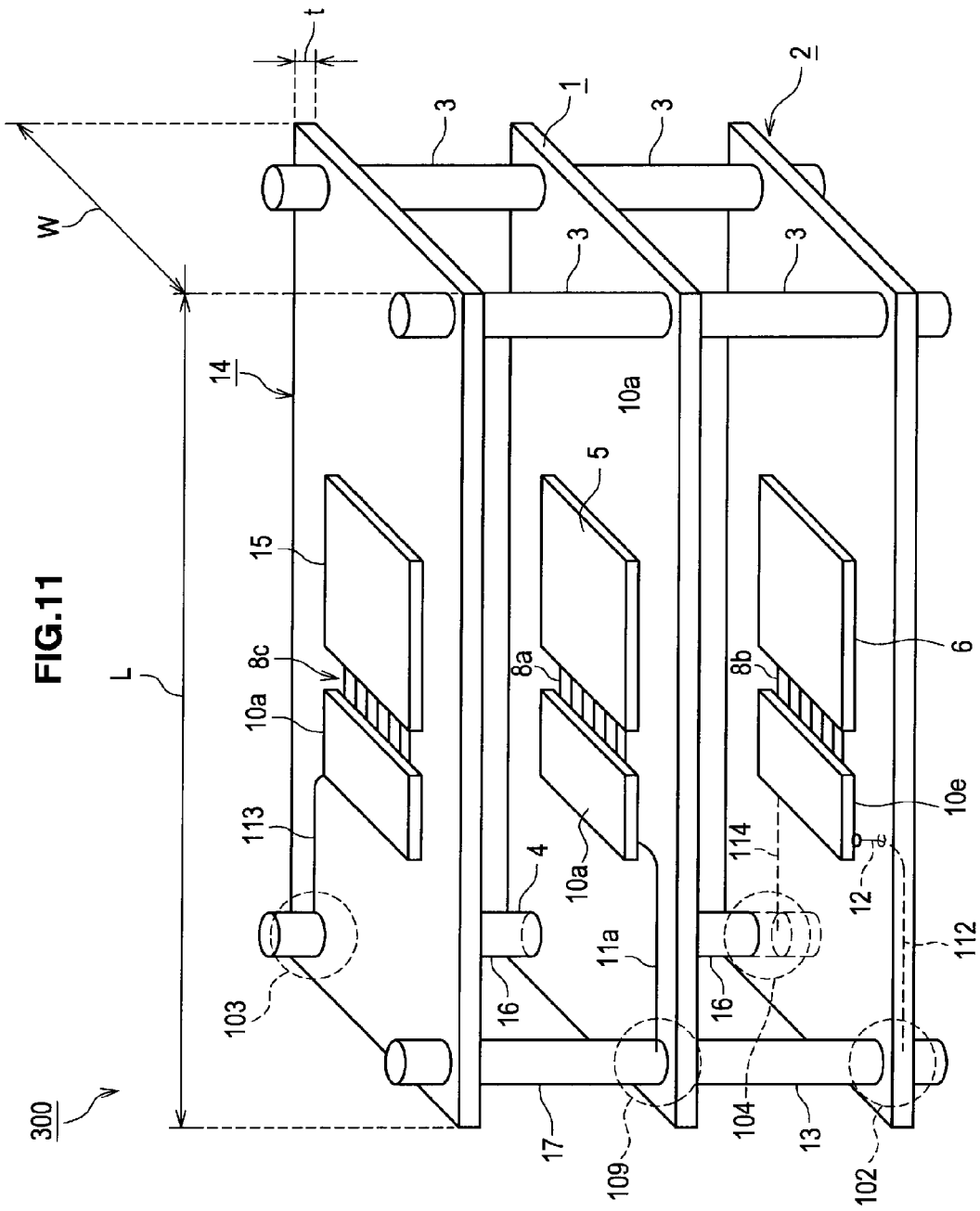
FIG. 11 is a perspective view showing an example of the configuration of an in-millimeter-wave dielectric transmission device 300 with a multi-stage structure as a third embodiment.

FIG. 11 is a perspective view showing an example of the configuration of an in-millimeter-wave dielectric transmission device 300 with a multi-stage structure as the third embodiment. In this embodiment, unlike the in-millimeter-wave dielectric transmission device 100 (a basic configuration) described in the first embodiment, a third printed board 14 is fixed above a printed board 1, and data transmission is performed between a signal processing unit 15 on the third printed board 14 and a signal processing unit 6 of a printed board 2 below the printed board 1 through a fixing member 16 constituting a dielectric transmission path.

The in-millimeter-wave dielectric transmission device 300 shown in FIG. 11 can be applied to a millimeter wave video data transmission device, a millimeter wave video data transmission system and the like, which convert data of a movie image, a computer image and the like into a plurality of millimeter wave signals S and transmit the millimeter wave signals at a high speed, and have a carrier frequency of 30 GHz to 300 GHz for carrying the millimeter wave signals.

In this embodiment, one piece of third signal processing board (hereinafter, referred to as the printed board 14) is provided above (at an outer side of) the printed board 1. In relation to the printed board 14, the fixing member 16 as a second fixing member, which is different from the first fixing member 13 provided between the printed board 1 and the printed board 2, constitutes a dielectric transmission path. The fixing member 16 not only transmits a millimeter wave signal but also supports the printed board 14 on the printed board 1 in cooperation with other fixing members 3 and 17.

The printed board 14 converts data of a movie image, a computer image and the like into a millimeter wave signal. The size of the printed board 14, for example, is defined as a length L, a width W and a thickness t, in the same manner as that in the first embodiment. The printed board 14, for example, includes the signal processing unit 15, a signal generating unit 10*a*, a transmission line 113, and an antenna coupling unit 103.

The signal processing unit 15 performs a process such as compression with respect to the data of the movie image, the computer image and the like based on a predetermined standard to output an electrical signal (hereinafter, referred to as an input signal). The signal processing unit 15 is connected to an electrical wiring 8*c* such as a wiring pattern. The electrical wiring 8*c* is connected to the signal generating unit 10*a*. The signal generating unit 10*a* performs signal processing with respect to the input signal to generate a millimeter wave signal.

The signal generating unit 10*a* is connected to one end of the transmission line 113. The transmission line 113 is electrically connected between the signal generating unit 10*a* and the antenna coupling unit 103 to transmit the millimeter wave signal. In this embodiment, the transmission line 113 electrically transmits the millimeter wave signal constituting the data of the movie image, the computer image and the like. A scheme of a strip line, a microstrip line, a coplanar line, a slot line and the like is applied to the transmission line 113 on the printed board 14.

The antenna coupling unit 103 is coupled to (disposed at) the other end of the transmission line 113. The antenna coupling unit 103 couples the millimeter wave signal, which is transmitted from the signal generating unit 10*a* via the transmission line 113, to one end of the fixing member 16. In this embodiment, the antenna coupling unit 103 converts the millimeter wave signal into an electromagnetic wave, and radiates the electromagnetic wave into the fixing member 16 constituting the dielectric transmission path. At the time of bi-directional data transmission, the antenna coupling unit 103 transmits millimeter wave video data and the like between the transmission line 11*a* connected to the signal generating unit 10*a* and the fixing member 16 constituting the dielectric transmission path.

The fixing member 16 is provided between the printed board 14 and the printed board 2 while having a predetermined dielectric constant. As the fixing member 16, a dielectric material at least including a glass epoxy-based, acryl-based, or polyethylene-based resin is used. In this embodiment, two fixing members 3 and one fixing member 17 are provided at four corners of each of the printed boards 1 and 14 together with the one fixing member 16 which divide the charge. The fixing member 16 is provided at a corner part of each of the printed boards 1 and 14, rather than the arrangement positions of the fixing members 3 and 17 for normal support.

The fixing member 16 supports the printed board 1, the printed board 2 and the printed board 14 together with the fixing member 13 constituting the dielectric transmission path and the other fixing members 3 and 17. The support function includes a case where the printed board 2 holds up and supports the printed board 1 and the printed board 14 and a case where the printed board 14 is suspended and supports the printed board 1 and the printed board 2.

In the support mechanism, the fixing members 3, 13, 16 and 17 are fixed such that the printed board 14, the printed board 1 and the printed board 2 are combined with one another in a predetermined direction and maintain the substantially parallel posture, for example, the printed board 14, the printed board 1 and the printed board 2 are connected to one another in the vertical direction.

When configuring the in-millimeter-wave dielectric transmission device 300 in this way, the printed board 14, the printed board 1 and the printed board 2 can be fixedly stacked in a rack configuration in the vertical direction via the fixing members 3, 13, 16 and 17. In addition, the fixing members 3, 13, 16 and 17, for example, use a resin bar member formed in a cylindrical shape and having a male thread structure at the front end thereof. Of course, except for the fixing members 13 and 16, the fixing members 3 and 17 may also use a metal bar member having a predetermined shape.

The printed board 2, which receives an electromagnetic wave based on a millimeter wave signal from the printed board 14, includes antenna coupling units 102 and 104 of two systems, two transmission lines 112 and 114, a signal generating unit 10e and the signal processing unit 6, which are mounted thereon, receives an electromagnetic wave based on a millimeter wave signal from the printed board 1, that is, receives the millimeter wave signals of two systems, and performs signal processing with respect to the millimeter wave signals. In this embodiment, the two transmission lines 112 and 114 drawn out from the antenna coupling units 102 and 104 of the two systems are connected to the signal generating unit 10e. A scheme of a strip line, a microstrip line, a coplanar line, a slot line and the like is applied to the transmission lines 112 and 114 on the front and the back of the printed board 2.

The other end of the above-described fixing member 13 is bonded to the antenna coupling unit 102 provided at a first corner of the printed board 2. The antenna coupling unit 102 receives an electromagnetic wave from the fixing member 13 connected to the printed board 1 and converts the electromagnetic wave into a millimeter wave signal. The millimeter wave signal is output to the signal generating unit 10e through the transmission line 112. The other end of the fixing member 16 is bonded to the antenna coupling unit 104 provided at a second corner of the printed board 2. The antenna coupling unit 104 receives an electromagnetic wave from the fixing member 16 and converts the electromagnetic wave into a millimeter wave signal. The millimeter wave signal is output to the signal generating unit 10e through the transmission line 114.

Unlike the first and second embodiments, the signal generating unit 10e receives the respective millimeter wave signals, which are received in the antenna coupling units 102 and 104 of the two systems, via the two transmission lines 112 and 114, and generates an output signal by performing signal processing with respect to the millimeter wave signals of the two systems which are input via the transmission lines 112 and 114. The signal generating unit 10e, for example, is configured by providing the signal generating unit 10b, which is described in the first embodiment, in a row by two systems.

The signal processing unit 6 is connected to the signal generating unit 10e through an electrical wiring 8b such as a wiring pattern. The signal processing unit 6 performs a process such as expansion with respect to the output signal, which is generated by the signal generating unit 10e, based on a predetermined standard, thereby achieving data of a movie image, a computer image and the like.

The printed board 1 as described in the first embodiment is provided below the above-described printed board 14. The printed board 1 includes a signal processing unit 5, a signal generating unit 10a and a transmission line 11a, which are mounted thereon. However, unlike the first embodiment, the transmission line 11a is bonded to an antenna coupling unit 109.

Figure 12:
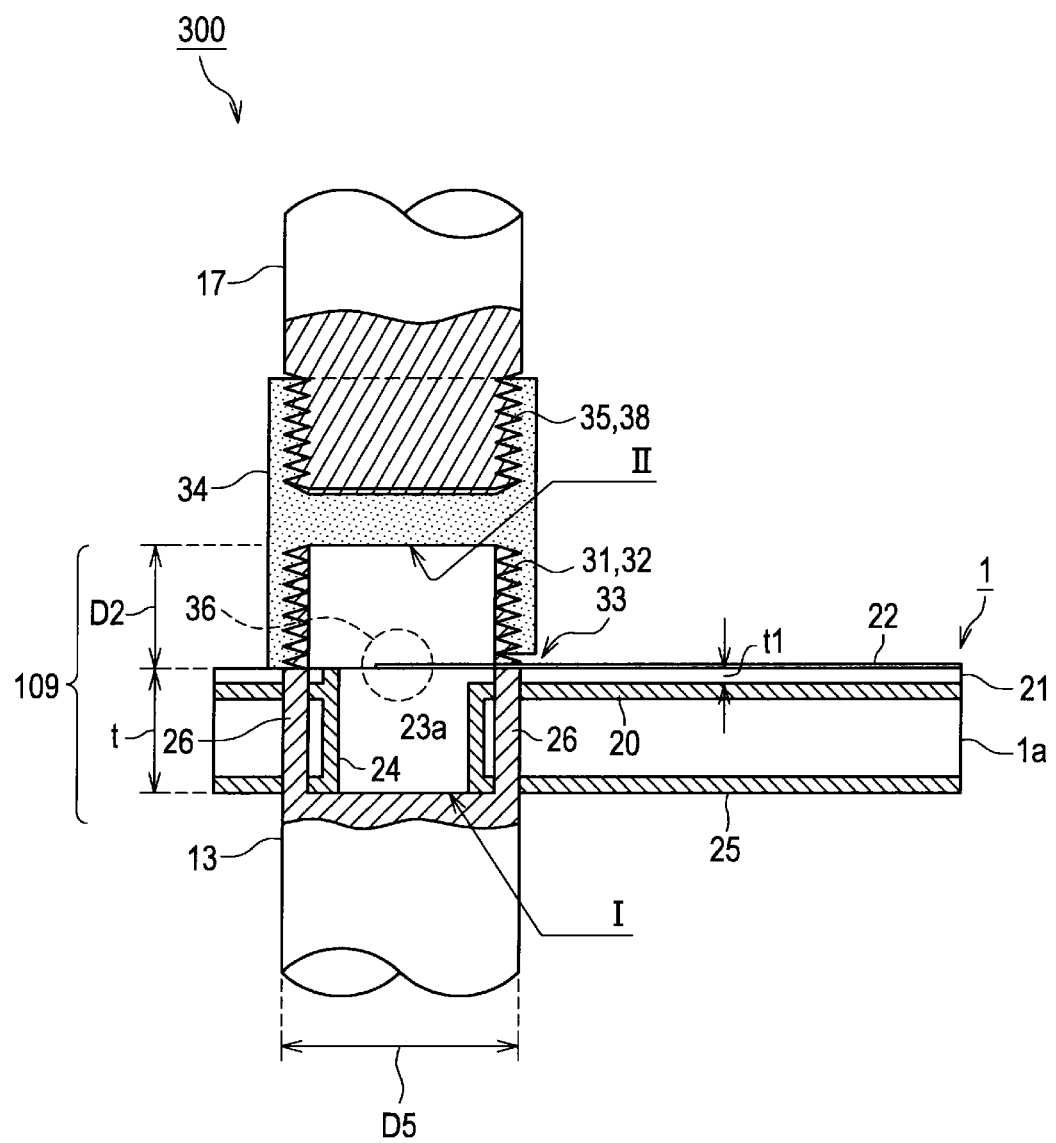
FIG. 12 is a sectional view showing an example of the configuration of an antenna coupling unit 109 of a printed board 1.

FIG. 12 is a sectional view showing an example of the configuration of the antenna coupling unit 109 of the printed board 1. According to the antenna coupling unit 109 shown in FIG. 12, unlike the configuration of the dielectric transmission path termination part 30 mounted at the termination part of the fixing member 13 described in FIGS. 2A, 2B and 3, a dielectric transmission path termination part 34 with a different structure is mounted. The dielectric transmission path termination part 34 is provided at the upper portion thereof with a female thread structure 35 and the lower portion thereof with a female thread structure 32, and has a part connection function of connecting the fixing member 17 provided above the dielectric transmission path termination part 34 to the fixing member 13 provided below the dielectric transmission path termination part 34. The dielectric transmission path termination part 34 uses the same material as the dielectric transmission path termination part 30, and a manufacturing method thereof is the same as that of the dielectric transmission path termination part 30.

In this embodiment, a male thread structure 38 is formed at the end portion of the fixing member 17, and the female thread structure 35 formed at the upper portion of the dielectric transmission path termination part 34 in correspondence with the male thread structure 38 is connected with the male thread structure 38 of the fixing member 17 by screwing. Since the female thread structure 32 formed at the lower portion of the dielectric transmission path termination part 34 has the same configuration and function as the dielectric transmission path termination part 30, detailed description thereof will be omitted (refer to FIG. 2B).

In addition, for a connection of the fixing member 16 constituting the dielectric transmission line in the printed board 1, the fixing member 16 is configured to be fixed in a general purpose thread structure via a through hole 4 formed in the printed board 1. Of course, it may also be possible to employ the part connection function of the dielectric transmission path termination part 34. In this way, the in-millimeter-wave dielectric transmission device 300 is configured.

Since the in-millimeter-wave dielectric transmission device 300 may employ the examples (1 to 3) of forming the in-millimeter-wave dielectric transmission device 100 shown in FIGS. 5 to 7 by replacing reference numerals, except for the assembly of the fixing members 16 and 17, detailed description thereof will be omitted.

As described above, according to the in-millimeter-wave dielectric transmission device 300 as the third embodiment, the printed board 14 is provided above (at an outer side of) the printed board 1. In relation to the printed board 14, both the fixing member 13 provided between the printed board 1 and the printed board 2 and the fixing member 16 different from the fixing member 13 constitute the dielectric transmission paths. The fixing member 16 not only transmits the millimeter wave signal but also supports the printed board 1 and the printed board 14 in cooperation with the other fixing members 3 and 17.

Consequently, it is possible to process the millimeter wave signal while transmitting and receiving the millimeter wave signal among a plurality of signal processing boards via the fixing member 13 and the fixing member 16 which constitute the dielectric transmission paths. For example, according to the downlink data transmission path of the millimeter wave, data transmission of a first system using a millimeter wave signal as a medium is performed via the signal processing unit 5 of the printed board 1→the signal generating unit 10a→the transmission line 11a→the antenna coupling unit 102→the fixing member 13→the antenna coupling unit 102→the transmission line 112→the signal generating unit 10b→the signal processing unit 6.

Furthermore, data transmission of a second system using a millimeter wave signal as a medium is performed via the signal processing unit 15 of the printed board 14→the signal generating unit 10a→the transmission line 113→the antenna coupling unit 103→the fixing member 16→the antenna coupling unit 104→the transmission line 114→the signal generating unit 10b→the signal processing unit 6. In addition, it is possible to configure a three-dimensional structure suitable for a housing shape. Consequently, mutual data transmission can be performed among the printed boards 1, 2 and 14 with the three-stage configuration.

Fourth Embodiment

Figure 13:
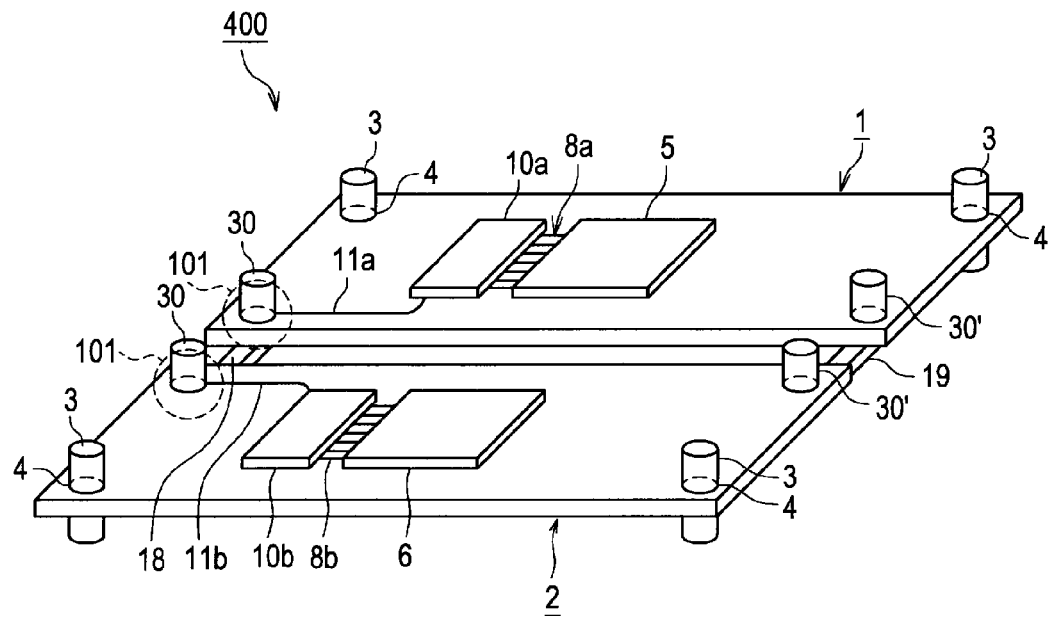
FIG. 13 is a perspective view showing an example of the configuration of an in-millimeter-wave dielectric transmission device 400 as a fourth embodiment.

FIG. 13 is a perspective view showing an example of the configuration of an in-millimeter-wave dielectric transmission device 400 as the fourth embodiment. In this embodiment, a fixing member 18 constituting a dielectric transmission path and a fixing member 19 for normal support are provided between two printed boards 1 and 2, and the printed boards 1 and 2 are horizontally supported by the fixing members 18 and 19.

The in-millimeter-wave dielectric transmission device 400 shown in FIG. 13 can be applied to a millimeter wave video data transmission device, a millimeter wave video data transmission system and the like, which convert data of a movie image, a computer image and the like into a plurality of millimeter wave signals S and transmit the millimeter wave signals at a high speed, and have a carrier frequency of 30 GHz to 300 GHz for carrying the millimeter wave signals.

According to the in-millimeter-wave dielectric transmission device 400, the fixing members 18 and 19 having a substantially flat U shape are provided, the printed board 1 and the printed board 2 are provided in a row, and the fixing members 18 and 19 are provided between the printed board 1 and the printed board 2, so that the printed board 1 and the printed board 2 are fixedly connected to each other and supported by the fixing members 18 and 19 while maintaining a substantially horizontal state. The fixing member 18 has a substantially flat U shape and is provided between the printed board 1 and the printed board 2 while having a predetermined dielectric constant. As the fixing member 18, a dielectric material at least including a glass epoxy-based, acryl-based, or polyethylene-based resin is used.

In this embodiment, four fixing members 3 having a predetermined height, one fixing member 19 and one fixing member 18 are provided at two upper corners, two lower corners and right and left connection parts of the printed boards 1 and 2 while dividing the charge. The fixing member 18 is provided at a connection part between the printed boards 1 and 2, rather than the arrangement positions of the fixing members 3 and 19 for normal support. In this embodiment, the fixing member 18 is provided at the left side of the connection part between the printed boards 1 and 2.

The fixing member 19 is provided at the right side of the connection part between the printed boards 1 and 2. The fixing member 19 has the same shape as the fixing member 18, but has no waveguide 23a or the like. That is to say, an antenna coupling unit 101 is not provided at the fourth corner of the printed board 1 and the third corner of the printed board 2. The four fixing members 3 provided at the two upper corners and the two lower corners of the printed boards 1 and 2 are configured to be fixed in a general purpose thread structure via through holes 4.

Furthermore, the printed board 1 connected by the fixing members 18 and 19 having a substantially flat U shape includes a signal processing unit 5, a signal generating unit 10a and a transmission line 11a which are mounted thereon, and the transmission line 11a is bonded to the antenna coupling unit 101. Since the functions and formation method of these members have been described in the first embodiment, detailed description thereof will be omitted. One end of the above-described fixing member 18 is bonded to the antenna coupling unit 101 provided at a first corner of the printed board 1. The antenna coupling unit 101 of the printed board 1 converts a millimeter wave signal into an electromagnetic wave and radiates the electromagnetic wave into the fixing member 18.

The printed board 2, which receives the electromagnetic wave based on the millimeter wave signal from the above-described printed board 1, includes the antenna coupling unit 101, a transmission line 11b, a signal generating unit 10b and a signal processing unit 6, which are mounted thereon, receives the electromagnetic wave based on the millimeter wave signal from the printed board 1, and performs signal processing with respect to the millimeter wave signal. A scheme of a strip line, a microstrip line, a coplanar line, a slot line and the like is applied to the transmission lines 11a and 11b on the surfaces of the printed boards 1 and 2.

The other end of the fixing member 18 is bonded to the antenna coupling unit 101 provided at a second corner of the printed board 2. The antenna coupling unit 101 of the printed board 2 receives the electromagnetic wave from the fixing member 18 and converts the electromagnetic wave into a millimeter wave signal. The millimeter wave signal is output to the signal generating unit 10b through the transmission line 11b. In addition, since the functions of the signal generating unit 10b and the signal processing unit 6 have been described in the first embodiment, detailed description thereof will be omitted.

Figure 14:
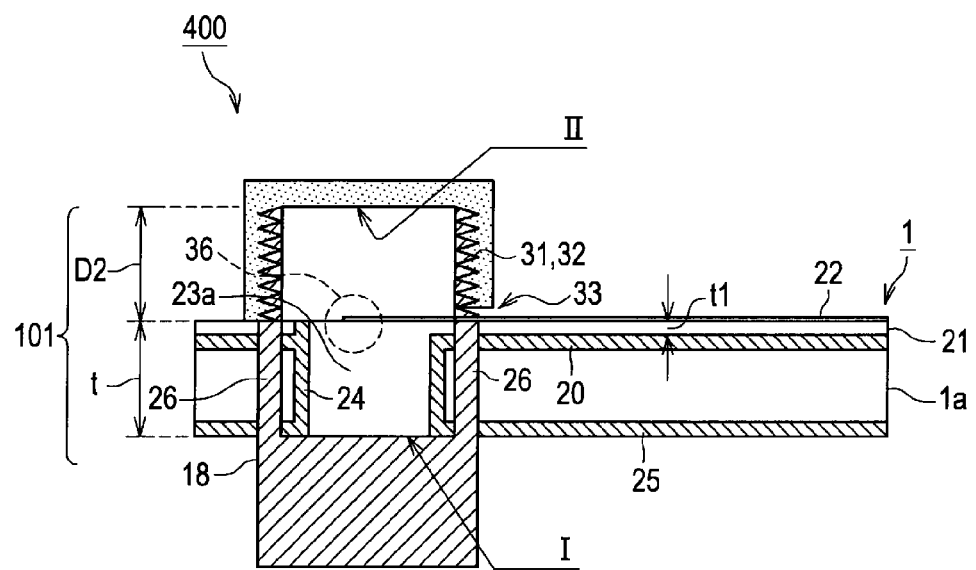
FIG. 14 is a sectional view showing an example in which an antenna coupling unit 101 is bonded to a fixing member 18.

FIG. 14 is a sectional view showing an example in which the antenna coupling unit 101 is bonded to the fixing member 18. In this embodiment, a microstrip line is applied to the transmission line 11a connected to the antenna coupling unit 101. The antenna coupling unit 101 shown in FIG. 14 is provided to the printed board 1, the printed board 2 and the like and includes a waveguide 23a, a through hole 26 and a signal converting section 36.

The shapes of the waveguide 23a and the through hole 26 are as described in the first embodiment. The waveguide 23a of the printed board 1 converts a millimeter wave signal electrically transmitted through the transmission line 11a into an electromagnetic wave, and transmits the electromagnetic wave to the dielectric transmission path. The end portion of the fixing member 18 is configured to be fixed to the printed board 1 by a dielectric transmission path termination part 30. In addition, since elements having the same reference numerals as those described in the first embodiment have the same functions and the formation method and dimensions thereof are as described in the first embodiment, detailed description thereof will be omitted.

Figure 15:
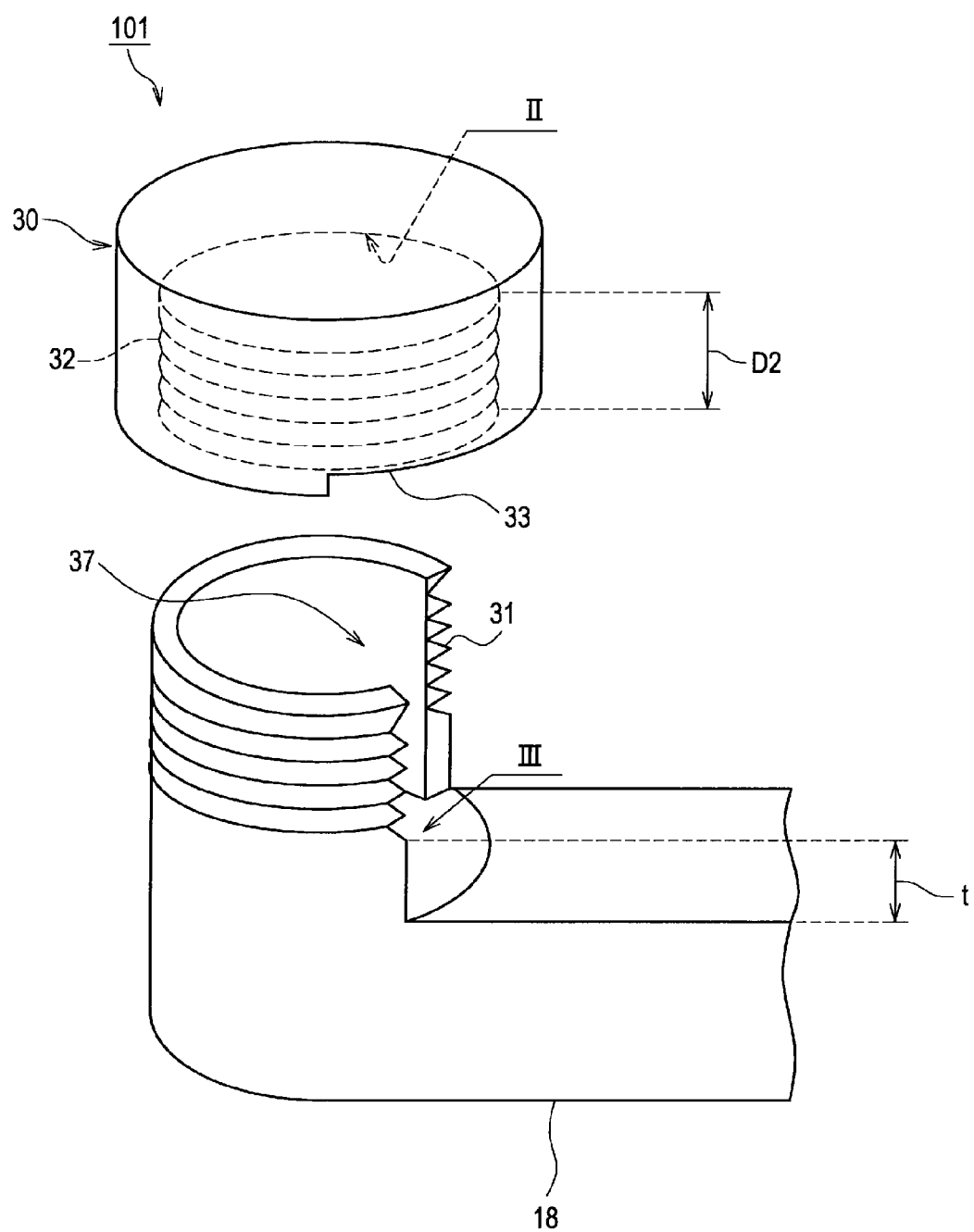
FIG. 15 is a perspective view showing an example of the shape of a fixing member 18 and a dielectric transmission path termination part 30.

FIG. 15 is a perspective view showing an example of the shape of the fixing member 18 and the dielectric transmission path termination part 30. In this example, the end portion of the fixing member 18 has substantially a C shape at the front end thereof such that the fixing member 18 can pass through the through hole 26 shown in FIG. 14. The end portion of the fixing member 18 having passed through the through hole 26 is bonded to the dielectric transmission path termination part 30 shown in FIG. 15, so that the fixing member 18 is fixed to the printed board 1. The fixing member 18 is also fixed to the printed board 2 in the same manner.

In this example, the front end of the fixing member 18 in the antenna coupling unit 101 has the same shape as the front end of the fixing member 13 shown in FIG. 3. However, the dielectric transmission path of the fixing member 18 is changed from a cylindrical shape of the fixing member 13 to a rectangular parallelepiped shape. Both front end portions of the fixing member 18 have a substantially flat U shape bent in an L shape. In addition, since the configuration of the dielectric transmission path termination part 30 and a mounting method thereof have been described in the first embodiment, i.e., fixing by a female thread structure 32 corresponding to a male thread structure 31 of the fixing member 18, detailed description thereof will be omitted.

In this example also, in the case where the distance between the printed board 1 and a ceiling surface II when the dielectric transmission path termination part 30 is fitted around the fixing member 18 is defined as D2, the distance D2 is set to ¼ of the wavelength λ of a millimeter wave signal on the air and adjusted to enhance an electromagnetic wave, so that the millimeter wave signal can be efficiently converted into an electromagnetic wave.

Since this example employs a structure in which the electromagnetic wave does not propagate in the vertical direction as with the first embodiment, but propagates through the dielectric transmission path having a substantially flat U shape in the horizontal direction, a reflector may also be provided immediately below the signal converting section 36. The reflector is set to an angle of 45° with respect to the direction in which the electromagnetic wave is radiated to the fixing member 18, or the horizontal direction in which the electromagnetic wave progresses, and totally reflects the electromagnetic wave, so that the propagation direction is bent at an angle of 90°.

When configuring the in-millimeter-wave dielectric transmission device 400 in this way, it is possible to confine an electromagnetic wave based on a millimeter wave signal in the fixing member 18 constituting the dielectric transmission path. Furthermore, the millimeter wave signal can be converted into an electromagnetic wave at the one end of the fixing member 18 constituting the dielectric transmission path, and the electromagnetic wave can be converted into the millimeter wave signal at the other end of the fixing member 18. In addition, since the in-millimeter-wave dielectric transmission device 400 may employ the examples (1 to 3) of forming the in-millimeter-wave dielectric transmission device 100 shown in FIGS. 5 to 7, except for the assembly of the fixing members 18 and 19, detailed description thereof will be omitted.

As described above, according to the in-millimeter-wave dielectric transmission device 400 of the fourth embodiment, the fixing member 18 constituting the dielectric transmission path and the fixing member 19 for normal support are provided between the two printed boards 1 and 2, so that the printed board 1 and the printed board 2 are fixedly connected to each other and supported by the fixing members 18 and 19.

Consequently, the printed board 1 and the printed board 2 can be expanded in the horizontal direction (two-dimensionally) via the fixing members 18 and 19. In addition, the electromagnetic wave based on the millimeter wave signal S radiated from the one end of the fixing member 18 constituting the dielectric transmission path can be received in the other end of the fixing member 18. Thus, it is possible to remove a communication cable, a connector and the like for connecting the printed board 1 to the printed board 2 according to the related art. In addition, support and high speed data transmission between the printed board 1 and the printed board 2 are performed by the fixing member 18 which is the same material. The high speed data transmission in the fixing member 18 is performed by a millimeter wave (an electromagnetic wave), the fixing member 18 constituting the dielectric transmission path is finished with a single material. Thus, processing demanding accuracy as with an optical waveguide is not necessary.

Moreover, when the printed board 1 and the fixing member 18 are fixed in the antenna coupling unit 101, strictness of position adjustment for stably performing data transmission is not necessary, unlike the case of employing an optical transmission method. According to the in-millimeter-wave dielectric transmission device 400, it is possible to perform support and high speed data transmission between the printed boards 1 and 2 with a simple and inexpensive configuration, resulting in the improvement of reliability of data transmission against vibration and deviation.

Fifth Embodiment

Figure 17A:
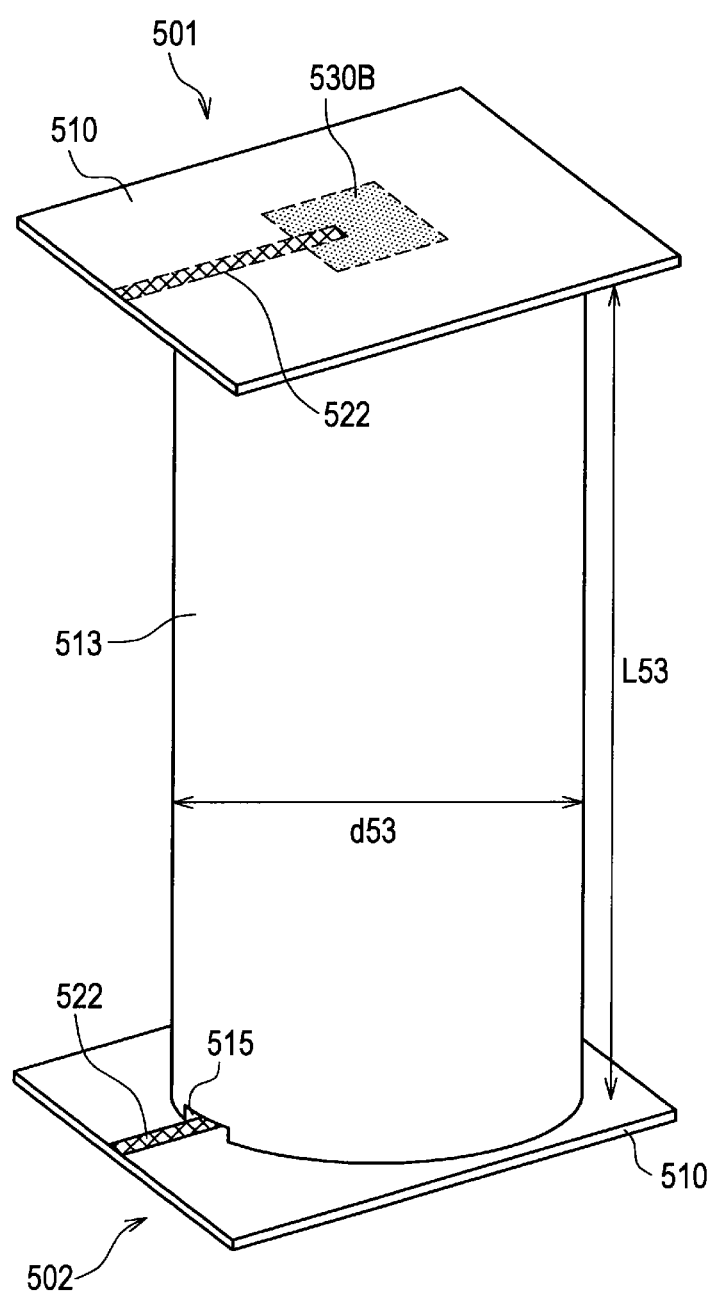
FIG. 17A is an overall view explaining details of an antenna coupling unit and a waveguide.
Figure 17B:
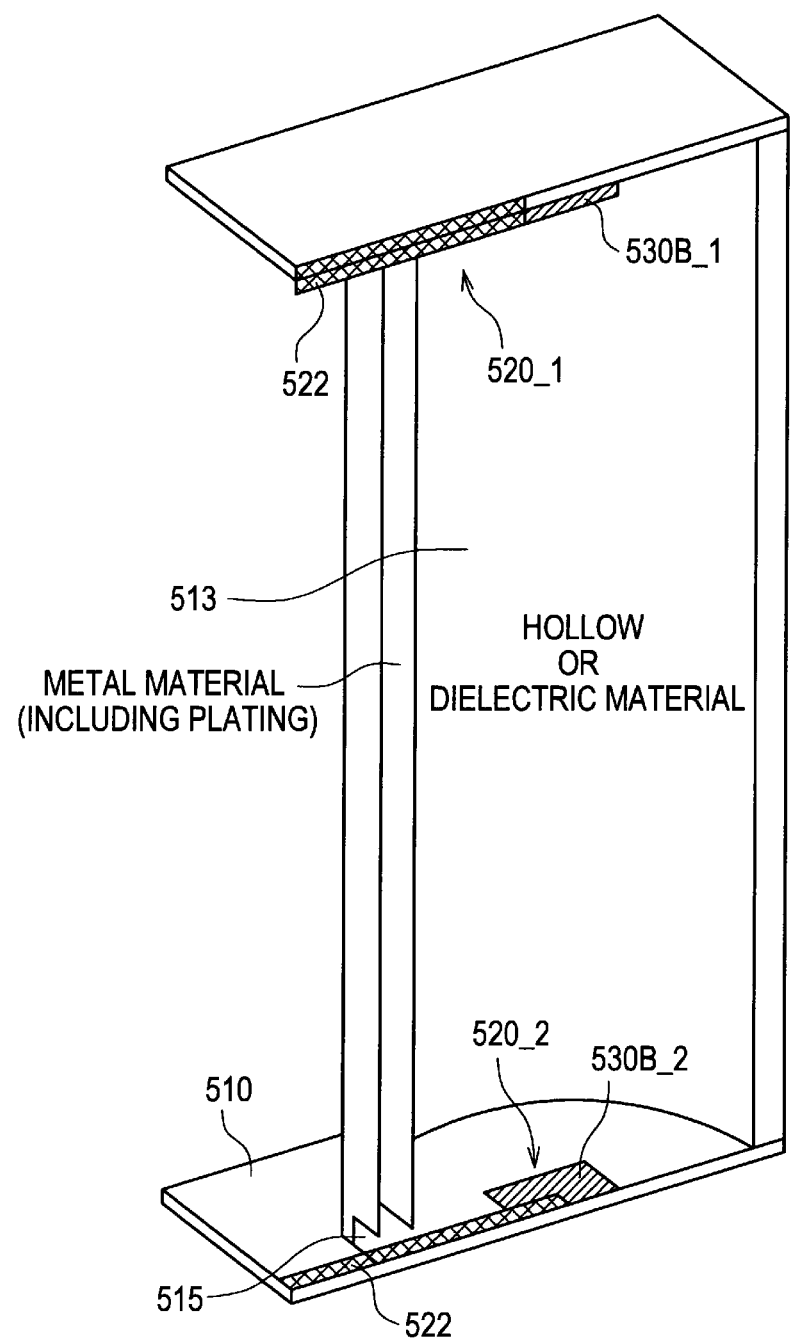
FIG. 17B is a sectional view explaining details of an antenna coupling unit and a waveguide.
Figure 17C:
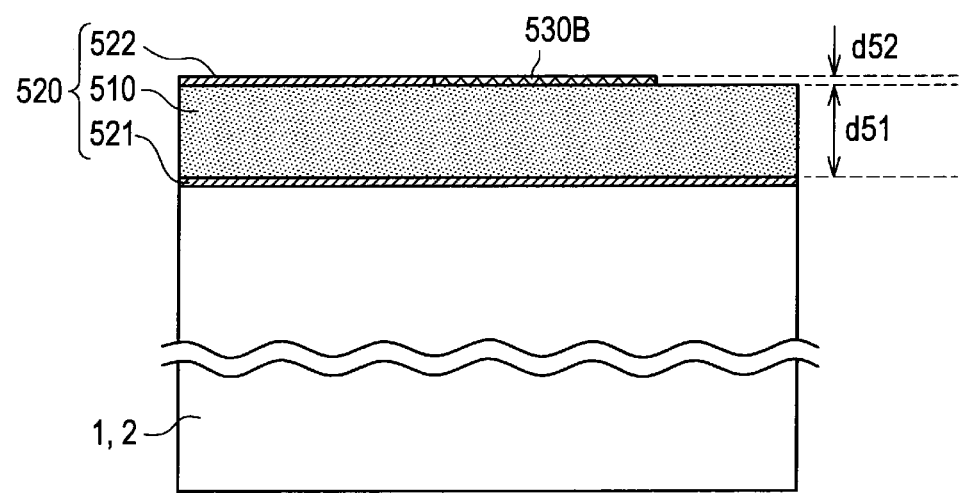
FIG. 17C is a sectional view of an antenna coupling unit.
Figure 17D:
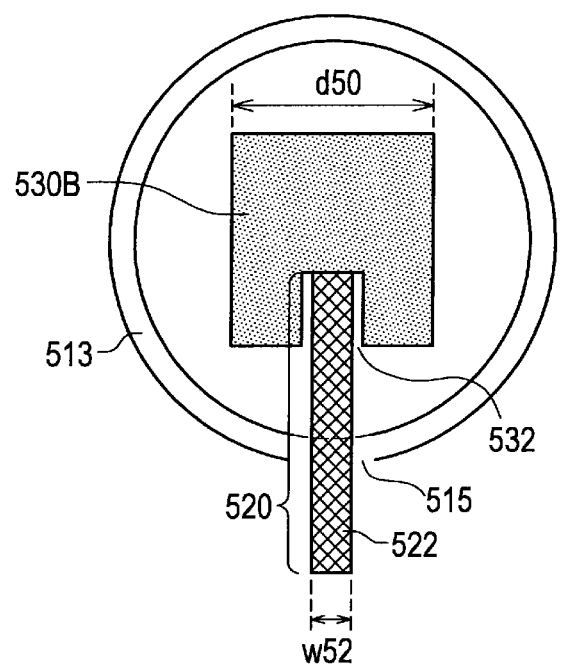
FIG. 17D is a plan view showing an antenna structure.
Figure 18:
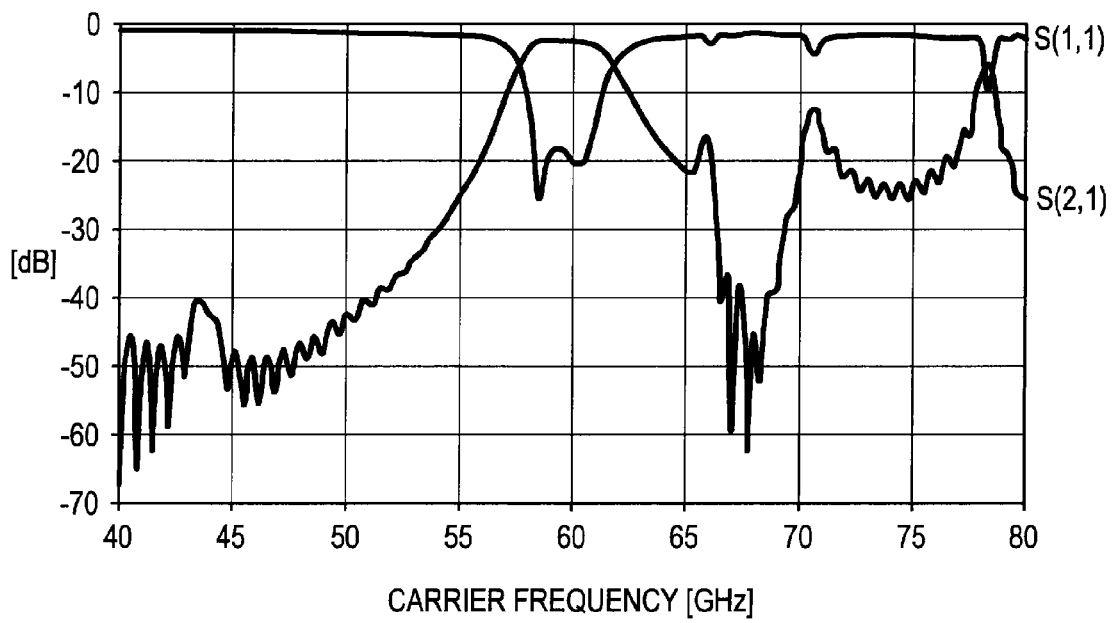
FIG. 18 is a diagram explaining an example of a simulation characteristic of a fifth embodiment.

FIGS. 16, 17A to 17D, 18 and 19A to 19D are diagrams explaining the fifth embodiment. FIG. 16 is a perspective view showing an example of the configuration of a wireless transmission device 500 of the fifth embodiment. FIGS. 17A to 17D are diagrams explaining details of an antenna coupling unit and a waveguide of the fifth embodiment. FIG. 18 is a diagram explaining an example of a simulation characteristic of the fifth embodiment. FIGS. 19A to 19D are diagrams explaining a modified example of an antenna structure (specifically, an antenna pattern).

The fifth embodiment relates to a wireless transmission mechanism in which a signal (a baseband signal) to be transmitted is converted to a high frequency signal with a high frequency and a frequency band thereof is not limited to a millimeter wave band. For example, it is also considered to employ a microwave band in addition to the millimeter wave band. Furthermore, the fifth embodiment relates to a wireless transmission mechanism in which a support member for supporting a circuit board of a transmission side or a reception side is not limited to an object made of a dielectric material. FIG. 16 shows a modified example of the first embodiment. However, the method of the fifth embodiment can be applied to the second to fourth embodiments. Hereinafter, the fifth embodiment will be described while focusing on the differences between the first embodiment and the fifth embodiment.

[Entire Configuration]

As shown in FIG. 16, in the wireless transmission device 500, the fixing member 13, which is an example of a support member also used as a dielectric transmission path in the in-millimeter-wave dielectric transmission device 100 of the first embodiment, is replaced with a waveguide 513 which is an example of a support member also used as a wireless signal transmission path. Furthermore, the antenna coupling unit 101 is replaced with an antenna coupling unit 501 and the antenna coupling unit 102 is replaced with an antenna coupling unit 502. The antenna coupling units 501 and 502 include dielectric boards 510 provided on printed boards 1 and 2, and antenna patterns (which will be described later) formed on the dielectric boards 510, respectively.

The antenna coupling unit 501 and the antenna coupling unit 502 form a symmetric structure with respect to opposite surfaces of the printed boards 1 and 2 because the dielectric boards 510 of the antenna coupling units 501 and 502 are provided on the surface of the printed board 1 facing the printed board 2 and the surface of the printed board 2 facing the printed board 1, respectively.

For example, in the printed board 1, the antenna coupling unit 501 is signal-coupled to the waveguide 513 constituting the wireless signal transmission path and transmits/receives an electromagnetic wave via the waveguide 513. One end of a transmission line 11a is coupled to (disposed at) the dielectric board 510_1 disposed on the surface (rear surface) of the printed board 1 facing the printed board 2. In this embodiment, the transmission line 11a is disposed on the rear surface of the printed board 1 and is wired to a signal generating unit 10a on the surface of the printed board 1 through a contact hole 12 (a via hole).

Meanwhile, in the printed board 2, the antenna coupling unit 502 is signal-coupled to the waveguide 513 constituting the wireless signal transmission path and transmits/receives an electromagnetic wave via the waveguide 513. One end of a transmission line 11b is coupled to (disposed at) the dielectric board 510_2 disposed on the surface of the printed board 2 facing the printed board 1. In this embodiment, the transmission line 11b is disposed on the surface of the printed board 2 and is connected to a signal generating unit 10b on the surface of the printed board 2.

The waveguide 513 is provided at a corner part between the printed board 1 and the printed board 2, rather than the arrangement positions of fixing members 3 for normal support. The waveguide 513 surrounds the antenna pattern, which will be described later, and, for example, adheres to the dielectric boards 510, so that relative positions thereof are fixed. In the drawing, the waveguide 513 is shown in a cylindrical shape. However, the present invention is not limited thereto. For example, the section of the waveguide 513 is not limited to a circular shape, and may have a rectangular shape, shapes other than the rectangular shape, an oval shape and the like. The waveguide 513 not only constitutes the wireless signal transmission path but also supports the printed board 1 and the printed board 2 together with the other three fixing members 3.

The waveguide 513 may also be hollow (that is, the waveguide 513 is filled with air). That is, the waveguide 513 constitutes the wireless signal transmission path (e.g., a millimeter wave signal transmission path), and a shield member (e.g., a metal material) for blocking external radiation of a wireless signal (an electric wave) may be provided to surround the transmission path so that the transmission path inside the shield member may be a hollow waveguide (a cavity waveguide).

Furthermore, filling the waveguide 513 with a dielectric material may also be considered. By filling the dielectric material, multiple reflection in the waveguide can be prevented and a sectional size (a pipe diameter) of the waveguide can be reduced. For example, in the case where the waveguide 513 is a circular waveguide, when a specific dielectric constant of filled dielectric substance is defined as $\in$, the diameter of the waveguide can be reduced by about $1/\sqrt{\in}$ times as compared with the case where a waveguide is hollow. Furthermore, a reflection component due to mismatching of transmission (reception) ports is multiply reflected in the waveguide, causing adverse effect on the transmission (reception) ports. Herein, when the waveguide is filled with air, since passing loss occurs rarely, a power level is not attenuated even in the multiple reflection, resulting in large adverse effects. However, if a dielectric substance having a loss is filled, a power level of a reflected wave is attenuated, resulting in the suppression of adverse effects.

Even when the waveguide 513 is filled with a dielectric material, it is preferable that a shield member (e.g., a metal material) is used as a peripheral member of the waveguide 513. In short, a signal transmission path for transmitting an electromagnetic wave may be air (that is to say, free space). However, it is preferable to have a structure capable of transmitting an electromagnetic wave while confining an electromagnetic wave in a transmission path. In addition, in the case of creating the waveguide 513 filled with a dielectric substance, filling a cylindrical member made of a metal material with a dielectric substance or performing a surface process (called metal plating) of coating a metal thin film to cover the outer periphery of the dielectric material may be considered. According to a structure in which metal plating is performed with respect to the outer periphery of the dielectric material, along with miniaturization, lightness can be achieved as compared with the case where dielectric substance is filled in a metal housing. Meanwhile, according to a structure in which a dielectric material is filled in a cylindrical member made of a metal material, strength can be increased as compared with the case of performing metal plating.

[Electromagnetic Wave Coupling Structure]

FIGS. 17A to 17D show details of an electromagnetic wave coupling structure including the antenna coupling units 501 and 502 and the waveguide 513. FIG. 17A is an overall view and FIG. 17B is a side-sectional view thereof FIG. 17C is a sectional view focusing on the printed boards 1 and 2 and the dielectric board 510. FIG. 17D is a view explaining an antenna pattern.

The electromagnetic wave coupling structure includes the dielectric board 510_1 constituting a part of the antenna coupling unit 501 of the printed board 1, the dielectric board 510_2 constituting a part of the antenna coupling unit 502 of the printed board 2, and the waveguide 513 constituting a transmission path (a waveguide) interposed between the dielectric board 510_1 and the dielectric board 510_2 to allow an electric wave to propagate therethrough.

As described in FIG. 16, the dielectric board 510_1 is disposed on the rear surface of the printed board 1 and the dielectric board 510_2 is disposed on the surface of the printed board 2. The printed boards 1 and 2 are provided with the antenna coupling units 501 and 502 (transmission path coupling units) including the transmission lines 11a and 11b (microstrip lines), which are an example of lines electrically connected to the signal generating units 10 (not shown), respectively. For example, the waveguide 513 is provided at both ends thereof with the antenna coupling units 501 and 502 which supply or receive an electromagnetic wave to/from the waveguide 513, respectively.

In the antenna coupling units 501 and 502, as shown in FIG. 17C, a thin conductor layer 521 serving as a ground conductor is first formed on the printed boards 1 and 2, and a dielectric board 510 serving as a dielectric layer and having a thickness d51 is disposed on the thin conductor layer 521. A conductor line 522 having a width w52 and connected to the transmission lines 11 (11a and 11b) is formed on the surface of the dielectric board 510. An antenna structure is coupled to the front end of the conductor line 522 to radiate an electromagnetic wave. The conductor layer 521, the dielectric board 510 and the conductor line 522 are configured to form a microstrip line 520.

The antenna structure provided to the front end of the conductor line 522 represents a structure in a coupling section with a signal transmission path (the conductor line 522) configured in the waveguide 513, may allow an electrical signal of a microwave band or a millimeter wave band to be coupled to a the signal transmission path, and does not represent an antenna itself. For example, the antenna structure includes an antenna terminal, a microstrip line, and an antenna.

In the fifth embodiment, as an antenna with the antenna structure, a patch antenna 530B including a rectangular patch pattern (an antenna pattern) is used as shown in FIG. 17D. A cutout structure 532 is formed at a coupling section of the conductor line 522 and the patch antenna 530B to adjust a feeding point.

The waveguide 513 is formed with a gap part 515 for preventing the waveguide 513 from making contact with the conductor line 522. The hollow waveguide 13 is disposed between the printed boards 1 and 2 such that the center of a diameter coincides with the center of the patch antenna 530B. The waveguide 51 is fixed to the dielectric board 510 using adhesive to surround the patch antenna 530B. The second floor of the dielectric board 510 serves as a conductor line (the conductor layer 521) and is terminated.

With such a configuration, a millimeter wave signal, for example, is fed from a microstrip line 520_1 of the antenna coupling unit 501 to a patch antenna 530B_1 and coupled to the waveguide 513, thereby propagating the waveguide. Then, the millimeter wave signal is coupled to a patch antenna 530B_2 of the antenna coupling unit 502 and transmitted to a microstrip line 520_2. In the case of reverse transmission, a millimeter wave signal is fed from the microstrip line 520_2 of the antenna coupling unit 502 to the patch antenna 530B_2 and coupled to the waveguide 513, thereby propagating the waveguide. Then, the millimeter wave signal is coupled to the patch antenna 530B_1 of the antenna coupling unit 501 and transmitted to the microstrip line 520_1.

[Simulation]

A case where the waveguide 513 is applied to the wireless transmission device 500 will be described based on S parameters obtained by simulating a pass characteristic (size of loss) and a reflection characteristic using the AET MW-STUDIO.

Table 1 shows parameters provided to a simulation model of the wireless transmission device 500. For example, the patch antenna 530B has an approximately square shape and one side d50 thereof is 1.3 mm. The thickness d51 of the dielectric board 510 is 0.1 mm. The conductor line 522 has a width w52 of 0.2 mm and a thickness d52 of 0.02 mm. The waveguide 513 is a hollow waveguide and has a diameter d53 of 3.45 mm and a length L53 (i.e., an inter-board distance) of 5 mm. The dielectric board 510 has specific dielectric constant of 3.4 and dielectric loss tangent tan δ 0.01. Although not shown in Table 1, similarly to the first embodiment, the printed boards 1 and 2 have thicknesses of 1.0 mm, specific dielectric constants of 3.5 and dielectric loss tangents tan δ of 0.005, respectively.

TABLE 2

| Parameter | Value | Unit |
| --- | --- | --- |
| Diameter d50 of patch antenna 530 | 1.3 | mm |
| thickness d51 of dielectric board 510 | 0.1 | mm |
| width w52 of conductor line 522 | 0.2 | mm |
| thickness d52 of conductor line 522 | 0.02 | mm |
| diameter d53 of waveguide 513 (hollow waveguide) | 3.45 | mm |
| length L53 of waveguide 513 (hollow waveguide) | 5 | mm |
| specific dielectric constant of dielectric board 510 | 3.4 | none |
| dielectric loss tangent of dielectric board 510 (1 GHz) | 0.01 | none |

FIG. 18 is a graph showing an example of a simulation characteristic (pass characteristic S (2, 1) and a reflection characteristic S (1, 1)) of the wireless transmission device 500, and corresponds to FIG. 9 of the first embodiment.

According to a simulation result of the pass characteristic S (2, 1) dB, video data based on the millimeter wave signal S has passing loss of several dB (about 2 dB) in the vicinity of a carrier frequency of 60 GHz.

According to a simulation result of the reflection characteristic S (1, 1) dB, reflection loss of −10 dB or less is achieved in the range in which a carrier frequency is 57.7 GHz to 61.1 GHz.

As described above, in the wireless transmission device 500 of the first embodiment, at least a part of the support members of the printed boards 1 and 2 is used as a wireless signal transmission path, and the basic concept is not different from the first to fourth embodiments. Even when the patch antenna 530B is used as an antenna structure or a hollow waveguide is used as the waveguide 513, wireless transmission of a millimeter wave can be performed without inconvenience as can be seen from the simulation results.

Since the original support structure of the waveguide 513 can be used as a wireless signal transmission path, it is possible to achieve the same effects as those in the first to fourth embodiments, such as removal of a communication cable, a connector and the like for connecting the printed board 1 to the printed board 2 according to the related art.

[Modified Example of Antenna Structure]

FIGS. 19A to 19D show modified examples of an antenna structure (an antenna pattern) used in the wireless transmission device 500 of the first embodiment. The antenna pattern is not limited to the rectangular pattern forming the patch antenna 530B as shown in FIG. 17D. The antenna structure may be configured by forming an antenna pattern with a conductor pattern having a predetermined shape on the surface of the dielectric board 510 with respect to the conductor line 522 of 50Ω, formed on the surface of the dielectric board 510.

Figure 19A:
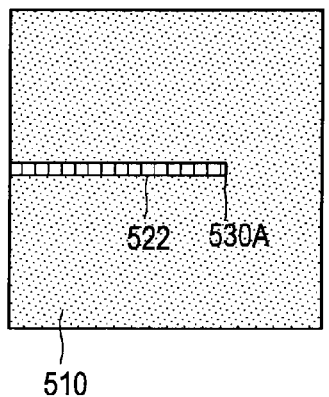
FIG. 19A is a diagram explaining a modified example (a microstrip antenna) of an antenna structure.

The first example shown in FIG. 19A is a microstrip antenna 530A using the end portion of the conductor line 522 as is. In such a case, a resonance structure serves as an antenna. In other words, it can be said that a microstrip line is used as an antenna.

Figure 19B:
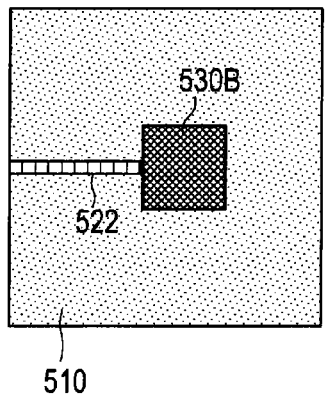
FIG. 19B is a diagram explaining a modified example (a patch antenna) of an antenna structure.

The second example shown in FIG. 19B is the same as that shown in FIG. 17D and is a structure in which the horizontal width of a line part (a strip part) of the microstrip antenna 530A is increased in order to improve the radiation efficiency of an electrical wave, as compared with the microstrip antenna 530A. Although not shown in FIG. 19B, the cutout structure 532 may be formed at the coupling section between the conductor line 522 and the patch antenna 530B to adjust the feeding point. In addition, in the example shown in FIG. 19B, the patch has a rectangular shape. However, the present invention is not limited thereto. For example, the patch may have a circular shape or other shapes.

Figure 19C:
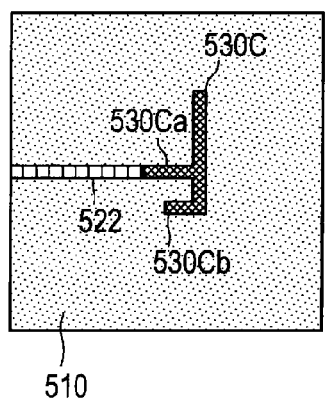
FIG. 19C is a diagram explaining a modified example (an inverted-F antenna) of an antenna structure.

The third example shown in FIG. 19C is a planar inverted-F antenna 530C. A feeding line 530Ca is connected to the conductor line 522, and a short-circuit line 530Cb is connected to a ground plane which is the conductor layer 521 formed on the surface of the lower portion of the dielectric board 510.

Figure 19D:
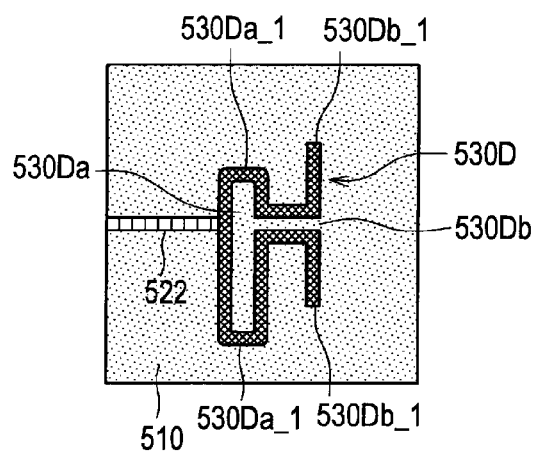
FIG. 19D is a diagram explaining a modified example (a differential antenna) of an antenna structure.
Figure 20:
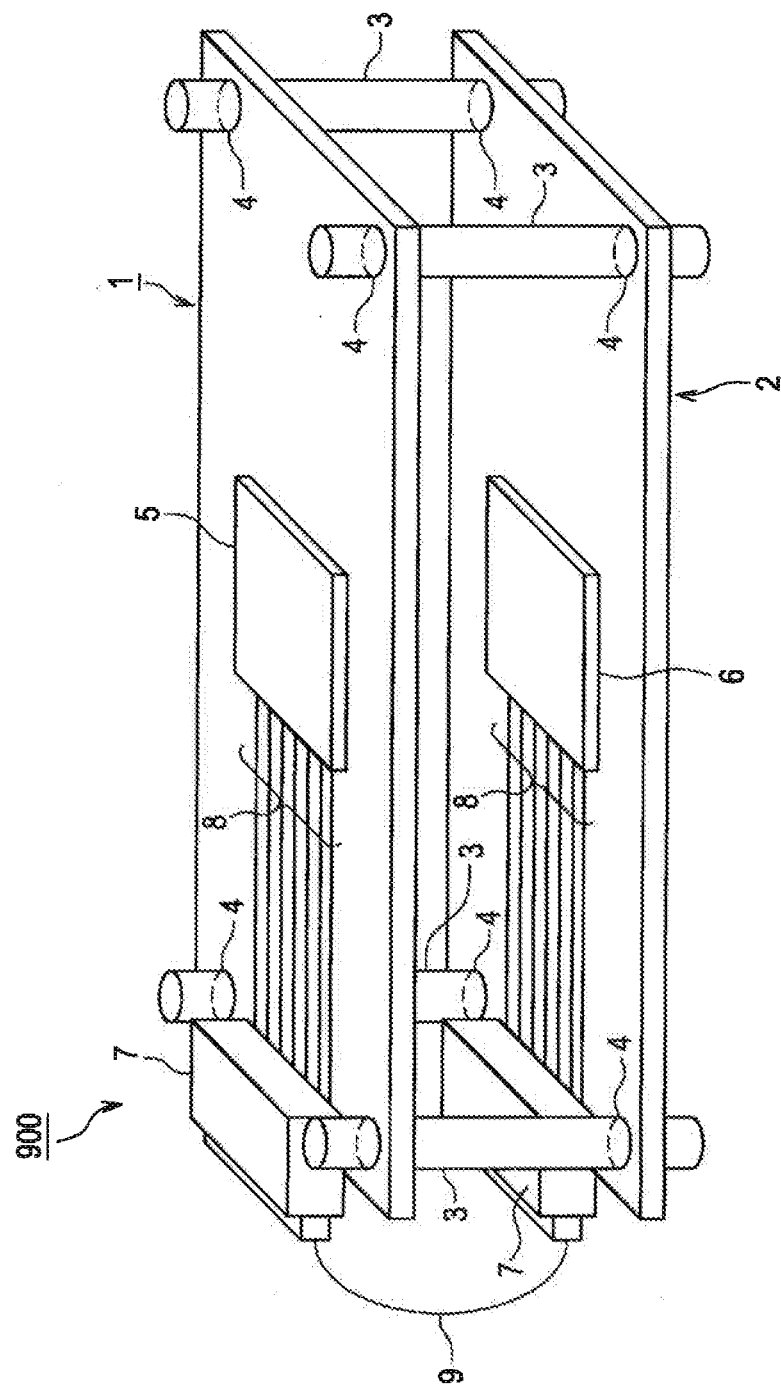
FIG. 20 is a perspective view showing an example of the configuration of a high speed data transmission device 900 according to the related art.

The fourth example shown in FIG. 19D is a differential antenna 530D and is configured by combining a phase shifter 530Da with a dipole antenna 530 Db. The phase shifter 530Da includes phase shifters 530Da_1 and 530Da_2 having line lengths different from each other. A connection point between the phase shifters 530Da_1 and 530Da_2 is connected to the conductor line 522. The other end of the phase shifter 530Da_1 is connected to one element 530Db_1 of the dipole antenna 530 Db, and the other end of the phase shifter 530Da_2 is connected to the other element 530Db_2 of the dipole antenna 530 Db. In the dipole antenna 530 Db, a phase difference is 180° at the other ends thereof by a difference between the line lengths of the phase shifters 530Da_1 and 530Da_2.

The previous embodiments are very suitable for an in-millimeter-wave dielectric transmission device, an in-millimeter-wave dielectric transmission method, an in-millimeter-wave dielectric transmission system and the like, which transmit a millimeter wave signal having a carrier frequency of 30 GHz to 300 GHz for carrying a movie image, a computer image and the like at a high speed.

The preferred embodiments of the present invention have been described above with reference to the accompanying drawings, while the present invention is not limited to the above examples, of course. A person skilled in the art may find various alternations and modifications within the scope of the appended claims, and it should be understood that they will naturally come under the technical scope of the present invention.

The invention claimed is:

1. A transmission device comprising:
   a first signal processing board operable to process a millimeter wave signal;
   a second signal processing board (i) signal-coupled to the first signal processing board, (ii) operable to receive the millimeter wave signal, and (iii) operable to perform signal processing with respect to the millimeter wave signal; and
   a support member provided between the first signal processing board and the second signal processing board, wherein,
      the support member (i) provides a dielectric transmission path between the first signal processing board and the second signal processing board, (ii) protrudes from opposing sides of each of the first signal processing board and the second signal processing board, (iii) supports the first signal processing board and the second signal processing board, and (iv) includes a cutout in an end portion of the support member, the cutout partially defined by edges of the support member extending through one of the first signal processing board and the second signal processing board.

2. The transmission device according to claim 1, wherein:
   (a) the first signal processing board includes;
      (i) a first signal generating unit for generating a millimeter wave signal by performing signal processing with respect to an input signal; and
      (ii) a first signal coupling unit for coupling the millimeter wave signal generated by the first signal processing unit to the support member,
   (b) the second signal processing board provided via the support member constituting the dielectric transmission path includes;
      (i) a second signal coupling unit for receiving the millimeter wave signal from the support member; and
      (ii) a second signal generating unit for generating an output signal by performing signal processing with respect to the millimeter wave signal received in the second signal coupling unit.

3. The transmission device according to claim 2, wherein:
   (a) the first signal processing board includes
      (i) a first transmission line electrically connected between the first signal generating unit and the first signal coupling unit to transmit a millimeter wave signal,
   (b) the first signal coupling unit
      (i) includes a first waveguide formed by a through hole which is opened in the first signal processing board and has a predetermined shape; and
      (ii) includes a first signal converting section disposed to enter the first waveguide and including the first transmission line to convert the millimeter wave signal into an electromagnetic wave, and
      (iii) is configured to transmit the electromagnetic wave converted by the first signal converting section to one end of the support member constituting the dielectric transmission path, and fix the one end of the support member to the first signal processing board by a through hole having a predetermined shape to surround the first waveguide;
   (c) the second signal processing board includes
      (i) a second transmission line electrically connected between the second signal generating unit and the second signal coupling unit to transmit a millimeter wave signal; and
   (d) the second signal coupling unit
      (i) includes a second waveguide formed by a through hole which is opened in the second signal processing board and has a predetermined shape; and
      (ii) includes a second signal converting section disposed to enter the second waveguide and including the second transmission line to convert an electromagnetic wave, which is propagated through the support member, into a millimeter wave signal, and
      (iii) is configured to convert an electromagnetic wave, which is propagated to the other end of the support member constituting the dielectric transmission path, into a millimeter wave signal by the second signal converting section, transmit the millimeter wave signal to the second transmission line via the second waveguide, and fix the other end of the support member to the second signal processing board by a through hole having a predetermined shape to surround the second waveguide.

4. The transmission device according to claim 3, wherein:
   the first signal coupling unit includes a first fixing means for reflecting an electromagnetic wave radiated from the first transmission line to the first waveguide, and fixing the one end of the support member to the first signal processing board, and
   the second signal coupling unit includes a second fixing means for reflecting the electromagnetic wave, which is propagated to the other end of the support member and not converted into the millimeter wave signal by the second signal converting section, and fixing the other end of the support member to the second signal processing board.

5. The transmission device according to claim 4, wherein:
   the first fixing means for fixing the one end of the support member has a first gap part at a position at which the first transmission line crosses the first waveguide, and
   the second fixing means for fixing the other end of the support member has a second gap part at a position at which the second transmission line crosses the second waveguide.

6. The transmission device according to claim 1, wherein a dielectric material at least including a glass epoxy-based, acryl-based, or polyethylene-based resin is used as the support member.

7. The transmission device according to claim 2, wherein:
   a modulation circuit for modulating the input signal and a first frequency conversion circuit for generating a millimeter wave signal by frequency-converting the input signal modulated by the modulation circuit are mounted on the first signal generating unit, and
   a second frequency conversion circuit for outputting an output signal by frequency-converting the millimeter wave signal and a demodulation circuit for demodulating the output signal, which is output from the second frequency conversion circuit, are mounted on the second signal generating unit.

8. The transmission device according to claim 7, wherein amplifiers for amplifying a millimeter wave signal are mounted on the first signal generating unit and the second signal generating unit, respectively.

9. The transmission device according to claim 1, wherein the support member is fixed such that the first signal processing board and the second signal processing board are combined in a predetermined direction and connected to each other while maintaining a substantially parallel posture.

10. The transmission device according to claim 1, wherein the support member is fixed such that the first signal processing board and the second signal processing board are provided in parallel to each other and connected to each other while maintaining a substantially horizontal state.

11. The transmission device according to claim 1, wherein a plurality of support members constituting the dielectric transmission path are provided between the first signal processing board and the second signal processing board, and each of the support members supports the first signal processing board and the second signal processing board and transmits the millimeter wave signal.

12. The transmission device according to claim 11, wherein the first signal processing board includes:
- a first signal generating unit for generating a plurality of millimeter wave signals by performing signal processing with respect to an input signal; and
- a plurality of first signal coupling units for coupling each of the millimeter wave signals generated by the first signal generating unit to each of the support members, and wherein the second signal processing board provided via the plurality of support members constituting the dielectric transmission path includes:
- a plurality of second signal coupling units for receiving the millimeter wave signal from each of the support members; and
- a second signal generating unit for generating an output signal by performing signal processing with respect to each of the millimeter wave signals received in the second signal coupling units.

13. The transmission device according to claim 1, wherein at least one third signal processing board is provided at an outer side of the first signal processing board or an outer side of the second signal processing board via a second support member constituting a dielectric transmission path, which is different from a first support member provided between the first signal processing board and the second signal processing board, and
- the second support member constitutes a dielectric transmission path, transmits a millimeter wave signal, and supports the third signal processing board.

* * * * *